United States Patent

Sorori

[11] Patent Number: 5,837,748
[45] Date of Patent: Nov. 17, 1998

[54] PHOTOPOLYMERIZABLE COMPOSITION

[75] Inventor: Tadahiro Sorori, Shizuoka, Japan

[73] Assignee: Fuji Photo Film Co., Ltd., Minami-ashigara, Japan

[21] Appl. No.: 908,611

[22] Filed: Aug. 8, 1997

Related U.S. Application Data

[63] Continuation of Ser. No. 590,138, Jan. 23, 1996, abandoned.

[30] Foreign Application Priority Data

Feb. 10, 1995 [JP] Japan ................................... 7-023133

[51] Int. Cl.$^6$ ....................................................... C08F 2/50
[52] U.S. Cl. ................................ 522/26; 522/25; 522/24; 522/27; 522/28; 522/29; 522/30
[58] Field of Search ................................ 522/16, 63, 26, 522/29, 25, 24, 27, 28, 30; 430/281.1

[56] References Cited

FOREIGN PATENT DOCUMENTS

A0563925  10/1993  European Pat. Off. .
A4418620  12/1994  Germany .

*Primary Examiner*—Marion E. McCamish
*Assistant Examiner*—Cheryl Juska
*Attorney, Agent, or Firm*—Burns, Doane, Swecker & Mathis, LLP

[57] ABSTRACT

A photopolymerizable composition is disclosed, comprising the following components (i), (ii) and (iii):

(i) a compound having at least one addition-polymerizable, ethylenically unsaturated bond;

(ii) a compound represented by formula (I):

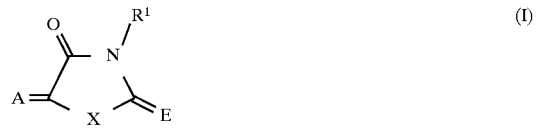

wherein A= represents a substituted or unsubstituted 2(3H)-thiazolylidene or 2-thiazolidinylidene group; —X— represents —O—, —S—, —NR$^2$— or —CONR$^3$—, in which R$_1$, R$^2$ and R$^3$ each independently represents a hydrogen atom, an alkyl group, a substituted alkyl group, an aryl group, a substituted aryl group, an alkenyl group, a substituted alkenyl group, an alkynyl group or a substituted alkynyl group; and=E represents a substituted or unsubstituted 1,3-dihydro-1-oxo-2H-inden-2-ylidene group; and (iii) a compound which generates an active radical upon light irradiation in the co-presence of component (ii).

8 Claims, No Drawings

# PHOTOPOLYMERIZABLE COMPOSITION

This is a continuation of application Ser. No. 08/590,138, filed Jan. 23, 1996 now abandoned.

FIELD OF THE INVENTION

The present invention relates to a photopolymerizable composition. More specifically, the present invention relates to a photopolymerizable composition comprising a novel photopolymerization initiation system having excellent light sensitivity to visible light.

BACKGROUND OF THE INVENTION

The photopolymerizable composition is a material which changes its physical properties of the composition as a result of polymerization reaction induced by light irradiation and is widely used in the fields of printing, printed circuit, fine processing such as ultra LSI, painting, ink, hologram recording and three dimensional modeling, thus the application of the composition is more and more expanding. The photopolymerizable composition fundamentally comprises an addition-polymerizable, ethylenically unsaturated compound and a photopolymerization initiator. The composition undertakes polymerization upon light irradiation and thereby is cured and insolubilized. Consequently, when the photosensitive composition having further added thereto, if desired, a binder resin having a film-forming ability and a thermal polymerization inhibitor is formed into an appropriate film and subjected to light irradiation through a desired negative image and only the non-irradiated area is removed by a proper solvent (hereinafter referred to simply as "development"), a desired cured image can be formed. Such an image formation method is well known very useful in preparing a printing plate.

The photopolymerization initiator conventionally used in the photopolymerizable composition includes benzil, benzoin ether, Michler's ketone, anthraquinone, acridine, phenazine or benzophenone. However, the composition comprising such a photopolymerization initiator is low in the photospeed and extremely poor in the photopolymerization ability to visible light at 400 nm or more as compared with the photopolymerization ability to light in the ultraviolet wavelength region of 400 nm or less. Accordingly, the photopolymerizable composition comprising a conventional photopolymerization initiator is strictly limited on the application range thereof.

A photosensitive composition highly cured by a small amount of light irradiation has been long demanded. Such a photosensitive composition is useful as a photosensitive material suitable, for example, for the projection exposure of non-contact type. Further, in recent years, an image information technique using a visible laser has come into a practical use stage. Accordingly, a photosensitive composition having a high photopolymerization ability to visible light is keenly demanded. The visible laser light which is very expected for use in such a method is an Ar$^+$ laser light having a wavelength of 488 nm. Furthermore, recently, energetic investigations are also being made on a light source having a long wavelength such as a YAG-SHG laser light having a wavelength of 532 nm and an He—Ne laser light having a wavelength of 543 nm.

With respect to the photopolymerizable composition comprising a photopolymerization initiation system sensitive to visible light, several proposals have been hitherto made. For example, U.S. Pat. No. 2,850,445 has reported that a certain kind of photosensitive dyes, such as Rose Bengal, eosine, and erythrosine, exhibit effective sensitivity to visible light. Also, improved techniques hitherto proposed include a composite initiation system containing a dye and an amine (see, JP-B-44-20189 (the term "JP-B" as used herein means an "examined Japanese patent pub lication")), a system containing a hexa-arylbiimidazole, a radical generating agent and a dye (see JP -B-45-37377), a system containing hexaarylbiimidazole and p-dialkylaminobenzylidene ketone (see, JP-B-47-2528, JP-A-54-155292 ( the term "JP-A" as used herein means an "unexamined published Japanese patent application")), a system containing a 3-ketocoumarin compound and an active halogen compound (JP-A-58-15503) and a system containing a substituted triazine and a merocyanine dye (see JP-A-54-15102). These techniques are surely effective to visible light but the sensitivity achieved is not high and, in practical viewpoint, they fail to reach a sufficiently satisfactory level. JP-A-2-244050 proposes a system containing a dye having a 4-thiazolidinone skeleton and a radical generating agent as a highly sensitive initiation system. This system is surely highly sensitive; however, the sensitivity is still insufficient and an initiation system on a higher level has been demanded. Further, this initiation system is bound to a problem that the photosensitivity in a wavelength region longer than 500 nm is conspicuously reduced as compared with the photosensitivity to the wavelength region of 500 nm or less, particularly, the sensitivity to the above-described laser light having a long wavelength, for example, a YAG-SHG laser light, is not satisfactory.

SUMMARY OF THE INVENTION

An object of the present invention is to provide a highly-sensitive photopolymerizable composition.

Another object of the present invention is to provide a photopolymerizable composition comprising a photopolymeriaztion initiator capable of increasing the photopolymerization rate of a photopolymerization composition containing an addition-polymerizable, ethylenically unsaturated compound.

A further object of the present invention is to provide a photopolymerizable composition containing a photopolymeriaztion initiator having high sensitivity also to visible light at 400 nm or more, particularly to light at 488 nm corresponding to the output of an Ar$^+$ laser and further to light having a wavelength longer than 500 nm corresponding to the output of a YAG-SHG laser or an He—Ne laser.

As a result of intensive investigations to achieve the above-described objects, the present inventors have found that a photopolymerizable composition containing a specific photopolymerization initiation system ensures a very high photopolymerization rate and shows high sensitivity even to visible light at 400 nm or more and also to visible light having a wavelength longer than 500 nm, and they have accomplished the present invention.

That is, these and other objects of the present invention have been attained by a photopolymerizable composition comprising the following components (i), (ii) and (iii):

(i) a compound having at least one addition-polymerizable, ethylenically unsaturated bond;

(ii) a compound represented by the following formula (I):

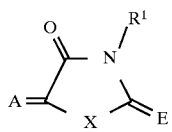

wherein A=represents a substituted or unsubstituted 2(3H)-thiazolylidene or 2-thiazolidinylidene group; —X— represents —O—, —S—, —NR²— or —CONR³—, in which $R^1$, $R^2$ and $R^3$ each independently represents a hydrogen atom, an alkyl group, a substituted alkyl group, an aryl group, a substituted aryl group, an alkenyl group, a substituted alkenyl group, an alkynyl group or a substituted alkynyl group; and =E represents a substituted or unsubstituted 1,3-dihydro-1-oxo-2H-inden-2-ylidene group; and (iii) a compound which generates an active radical upon light irradiation in the co-presence of component (ii).

DETAILED DESCRIPTION OF THE INVENTION

Each component of the photopolymerizable composition of the present invention will be described below in detail.

The compound having at least one addition-polymerizable, ethylenically unsaturated bond as component (i) used in the present invention is selected from the compounds having at least one, preferably two or more, ethylenically unsaturated terminal bonds.

The compound has a chemical form such as a monomer, a polymer, more specifically, a dimer, a trimer or an oligomer, a mixture of these or a copolymer of these. Examples of the monomer and copolymer thereof include esters of an unsaturated carboxylic acid (e.g., acrylic acid, methacrylic acid, itaconic acid, crotonic acid, isocrotonic acid, maleic acid) with an aliphatic polyhydric alcohol compound, and amides of an unsaturated carboxylic acid with an aliphatic polyhydric amine compound.

Specific examples of the monomer for the ester of an aliphatic polyhydric alcohol compound with an unsaturated carboxylic acid include:

acrylic ester, such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylol-ethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri (acryloyl-oxyethyl)isocyanurate, and polyester acrylate oligomer;

methacrylic ester, such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimeth-acrylate, 1,3-butanediol dimethacrylate, hexanediol dimeth-acrylate, pentaerythritol dimethacrylate, pentaerythritol trimethacrylate, pentaerythritol tetramethacrylate, dipenta-erythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis p-(methacryloxyethoxy)phenyl]dimethylmethane;

itaconic ester, such as ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate;

crotonic ester, such as ethylene glycol dicrotonate, tetramethylene glycol dicrotonate, pentaerythritol dicrotonate, and sorbitol tetradicrotonate;

isocrotonic ester, such as ethylene glycol diiso-crotonate, pentaerythritol diisocrotonate, and sorbitol tetraisocrotonate;

maleic ester, such as ethylene glycol dimaleate, triethylene glycol dimaleate, pentaerythritol dimaleate, and sorbitol tetramaleate; and a mixture of the above-described ester monomers.

Specific examples of the monomer for the amide of an aliphatic polyhydric amine compound with an unsaturated carboxylic acid include methylenebisacrylamide, methylenebis-methacrylamide, 1,6-hexamethylenebisacrylamide, 1,6-hexamethylenebismethacrylamide, diethylenetriaminetrisacrylamide, xylylenebisacrylamide, and xylylenebismethacrylamide.

Other examples include a vinyl urethane compound having two or more polymerizable vinyl groups in one molecule resulting from the addition of a vinyl monomer having a hydroxyl group represented by the following formula (D) to a polyisocyanate compound having two or more isocyanate groups in one molecule described in JP-B-48-41708:

$$CH_2=C(R)COOCH_2CH(R')OH \quad (D)$$

wherein R and R' each represents H or $CH_3$.

Also, a polyfunctional acrylate or methacrylate such as urethane acrylates described in JP-A-51-37193, polyester acrylates described in JP-A-48-64183, JP-B-49-43191 and JP-B -52-30490 and epoxy acrylates resulting from the reaction of an epoxy resin with a (meth)acrylic acid are included. Further, those described as a photocurable monomer or oligomer in *Nippon Secchaku Kyokaishi*, Vol. 1, 20, No. 7, pp. 300–308 (1984) may be used. The above-described monomer or prepolymer is used in an amount of from 5 to 70% by weight (hereinafter referred to simply as "%"), preferably from 10 to 55%, based on the entire components.

The component (ii) for use in the present invention is a compound represented by formula (I) above.

The 2(3H)-thiazolylidene group and the 2-thiazolidin-ylidene group represented by A=in formula (I) are represented by the following partial structural formulae (A-1) and (A-2), respectively.

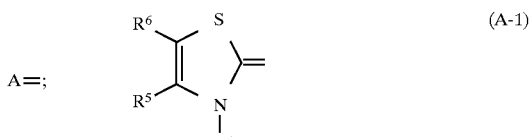

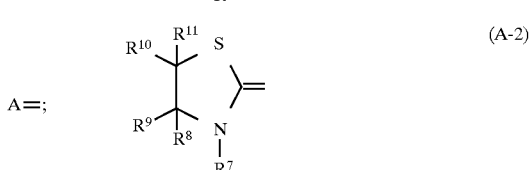

wherein $R^4$, $R^5$, $R^6$, $R^7$, $R^8$, $R^9$, $R^{10}$ and $R^{11}$ each independently represents a monovalent nonmetallic atom group;

more preferably, $R^4$ and $R^7$ each independently represents a hydrogen atom, an alkyl group, a substituted alkyl group, an aryl group, a substituted aryl group, an alkenyl group, a substituted alkenyl group, an alkynyl group or a substituted alkynyl group; and $R^5$, $R^6$, $R^8$, $R^9$, $R^{10}$ and $R^{11}$ each independently represents a hydrogen atom, a halogen atom, an alkyl group, a substituted alkyl group, an aryl group, a substituted aryl group, an alkenyl group, a substituted alkenyl group, a hydroxyl group, a substituted oxy group, a mercapto group, a substituted thio group, an amino group, a substituted amino group, a substituted carbonyl group, a sulfo group, a sulfonate group, a substituted sulfinyl group, a substituted sulfonyl group, a phosphono group, a substituted phosphono group, a phosphonate group, a substituted phosphonate group, a cyano group, a nitro group or a silyl group, and $R^5$ and $R^6$, $R^8$ and $R^9$, $R^8$ and $R^{10}$, $R^9$ and $R^{11}$, or $R^{10}$ and $R^{11}$ may be combined with each other to form a ring.

Preferred examples of R4 and $R^7$ in partial structural formulae (A-1) and (A-2) are described below in detail.

The alkyl group includes linear, branched and cyclic alkyl groups each having from 1 to 20 carbon atoms and specific examples thereof include a methyl group, an ethyl group, a propyl group, a butyl group, a pentyl group, a hexyl group, a heptyl group, an octyl group, a nonyl group, a decyl group, a undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group and 2-norbornyl group. Among these, a linear alkyl group having from 1 to 12 carbon atoms, a branched alkyl group having from 3 to 12 carbon atoms and a cyclic alkyl group having from 5 to 10 carbon atoms are more preferred.

The substituent for the substituted alkyl group includes a monovalent nonmetallic atom group excluding hydrogen and preferred examples thereof include a halogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'alkyl-N-alkylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxy-carbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group ($—SO_3H$) and a conjugate base group thereof (hereinafter called a sulfonate group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkyl-sulfamoyl group, an N,N-dialkylsulfamoyl group, an N-aryl-sulfamoyl group, an N,N-diarylsulfamoyl group, an -N-alkyl-N-arylsulfamoyl group, a phosphono group ($—PO_3H_2$) and a conjugate base group thereof (hereinafter called a phosphonate group), a dialkylphosphono group ($—PO_3(alkyl)_2$), a diarylphosphono group ($—PO_3(aryl)_2$), an alkylarylphosphono group ($—PO_3(alkyl)(aryl)$), a monoalkylphosphono group ($—PO_3H(alkyl)$) and a conjugate base group thereof (hereinafter called an alkylphosphonate group), a monoarylphosphono group ($—PO_3H(aryl)$) and a conjugate base group thereof (hereinafter called an arylphosphonate group), a phosphonoxy group ($—OPO_3H_2$) and a conjugate base group thereof (hereinafter called a phosphonatoxy group), a dialkyl-phosphonoxy group ($—OPO_3(alkyl)_2$), a diarylphosphonoxy group ($—OPO_3(aryl)_2$), an alkylarylphosphonoxy group ($—OPO_3(alkyl)-(aryl)$), a monoalkylphosphonoxy group ($—OPO_3H(alkyl)$) and a conjugate base group thereof (hereinafter called an alkylphosphonatoxy group), a monoarylphosphonoxy group ($—OPO_3H(aryl)$) and a conjugate base group thereof (hereinafter called an arylphosphonatoxy group), a cyano group, a nitro group, an aryl group, an alkenyl group and an alkynyl group.

Specific examples of the alkyl group in these substituents include the above-described alkyl groups and specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxy-phenyl group, an acetoxyphenyl group, a benzoyloxyphenyl group, a methylthiophenyl group, a phenylthiophenyl group, a methyl-aminophenyl group, a dimethylaminophenyl group, an acetylaminophenyl group, a carboxyphenyl group, a methoxycarbonyl-phenyl group, an ethoxyphenylcarbonyl group, a phenoxy-carbonylphenyl group, an N-phenylcarbamoylphenyl group, a phenyl group, a cyanophenyl group, a sulfophenyl group, a sulfonate phenyl group, a phosphonophenyl group and a phosphonate phenyl group. Examples of the alkenyl group include a vinyl group, a 1-propenyl group, a 1-butenyl group, a cinnamyl group and a 2-chloro-1-ethenyl group. Examples of the alkynyl group include an ethynyl group, a 1-propynyl group, a 1-butynyl group and a trimethylsilylethynyl group. $R^{12}$ in the acyl group ($R^{12}CO—$) includes hydrogen and the above-described alkyl and aryl groups. Among these substituents, more preferred are a halogen atom (—F, —Br, —Cl, —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonate group, a sulfamoyl group, an N-alkylsulfamoyl group, an N,N-dialkyl-sulfamoyl group, an N-arylsulfamoyl group, an N-alkyl-N-arylsulfamoyl group, a phosphono group, a phosphonate group, a dialkylphosphono group, a diarylphosphono group, a mono-alkylphosphono group, an alkylphosphonate group, a mono-arylphosphono group, an arylphosphonate group, a phosphonooxy group, a phosphonate oxy group, an aryl group and an alkenyl group.

The alkylene group in the substituted alkyl group includes a divalent organic residue resulting from eliminating any one of hydrogen atoms on the above-described alkyl group having from 1 to 20 carbon atoms and preferred are a linear alkylene group having from 1 to 12 carbon atoms, a branched alkylene group having from 3 to 12 carbon atoms and a cyclic alkylene group having from 5 to 10 carbon atoms. Specific preferred examples of the substituted alkyl group obtained by combining the substituent and the alkylene group include a chloromethyl group, a bromomethyl group, a 2-chloroethyl group, a trifluoromethyl group, a methoxymethyl group, a methoxy-ethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyl-oxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxy-carbonylmethyl group, a carbamoylmethyl group, an N-methyl-carbamoylethyl group, an N,N-dipropylcarbamoylmethyl group, an N-(methoxyphenyl)carbamoylethyl group, an N-methyl-N-(sulfo-phenyl)carbamoylmethyl group, a sulfobutyl group, a sulfonato-butyl group, a sulfamoylbutyl group, an N-ethylsulfamoylmethyl group, an N,N-dipropylsulfamoylpropyl group, an N-tolyl-sulfamoylpropyl group, an N-methyl-N-(phosphonophenyl)-sulfamoyloctyl group, a phosphonobutyl group, a phosphonato-hexyl group, a diethylphosphonobutyl group, a diphenylphosphonopropyl group, a methylphosphonobutyl group, a methyl-phosphonatobutyl group, a tolylphosphonohexyl group, a tolyl-phosphonatohexyl group, a phosphonoxypropyl group, a phosphonatoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

The aryl group for $R^4$ and $R^7$ in partial structural formulae (A-1) and (A-2) includes a condensed ring formed by from 1 to 3 benzene rings and a condensed ring formed by a benzene ring and a 5-membered unsaturated ring. Specific examples thereof include a phenyl group, a naphthyl group, an anthryl group, a phenanthryl group, an indenyl group, an acenaphthenyl group and a fluorenyl group, with the phenyl group and the naphthyl group being preferred.

The substituted aryl group includes those having a monovalent nonmetallic atom group exclusive of hydrogen as a substituent on the ring-forming carbon atoms of the above-described aryl group. Preferred examples of the substituent include the above-described alkyl groups, substituted alkyl groups and substituents for the substituted alkyl group. Preferred specific examples of the substituted aryl group include a biphenyl group, a tolyl group, a xylyl group, a mesityl group, a cumenyl group, a chlorophenyl group, a bromo-phenyl group, a fluorophenyl group, a chloromethylphenyl group, a trifluoromethylphenyl group, a hydroxyphenyl group, a methoxyphenyl group, a methoxyethoxyphenyl group, an allyl-oxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyl-oxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoyl-phenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, 2-butenyl group, a 2-methylallylphenyl group, a 2-methylpropenylphenyl group, a 2-propenylphenyl group, a 2-butynylphenyl group and a 3-butynylphenyl group.

The alkenyl group, the substituted alkenyl group, the alkynyl group and the substituted alkynyl group ($—C(R^{13})=C(R^{14})(R^{15})$ and $—C\equiv C(R^{16})$) include those where $R^{13}$, $R^{14}$, $R^{15}$ and $R^{16}$ each represents a monovalent nonmetallic atom group. Preferred examples of $R^{13}$, $R^{14}$, $R^{15}$ and $R^{16}$ include a hydrogen atom, a halogen atom, an alkyl group, a substituted alkyl group, an aryl group and a substituted aryl group. Specific examples of these groups include those described above and more preferred examples of the substituent for $R^{13}$, $R^{14}$, $R^{15}$ and $R^{16}$ include a hydrogen atom, a halogen atom and linear, branched and cyclic alkyl groups each having from 1 to 10 carbon atoms. Specific examples of $R^4$ and $R^7$ as described above include a vinyl group, a 1-butenyl group, a 1-pentenyl group, a 1-hexenyl group, a 1-octenyl group, a 1-methyl-1-propenyl group, a 2-methyl-1-propenyl group, a 2-methyl-1-butenyl group, a 2-phenyl-1-ethenyl group, a 2-chloro-1-ethenyl group, an ethynyl group, a propynyl group and a phenylethynyl group.

More preferred specific examples of $R^4$ and $R^7$ in partial structural formulae (A—1) and (A—2) include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, an allyl group, a 1-propenylmethyl group, a 2-butenyl group, a 2-methylallyl group, a 2-methylpropenyl group, a 2-propynyl group, a 2-butynyl group, a 3-butynyl group, a benzyl group, a phenethyl group, an a-methylbenzyl group, a 1-methyl-1-phenethyl group, a p-methylbenzyl group, a cinnamyl group, a hydroxyethyl group, a methoxyethyl group, a phenoxyethyl group, alloxyethyl group, a methoxyethoxyethyl group, an ethoxyethoxyethyl group, a morpholinoethyl group, a morpholinopropyl group, a sulfopropyl group, a sulfonate propyl group, a sulfobutyl group, a sulfonate butyl group, a carboxymethyl group, a carboxyethyl group, a carboxypropyl group, a methoxycarbonylethyl group, a 2-ethylhexyloxycarbonylethyl group, a phenoxycarbonylmethyl group, a methoxycarbonylpropyl group, an N-methylcarbamoylethyl group, an N,N-ethylaminocarbamoylmethyl group, an N-phenyl-carbamoylpropyl group, an N-tolylsulfamoylbutyl group, a p-trienesulfonylaminopropyl group, a benzoylaminohexyl group, a phosphonomethyl group, a phosphonoethyl group, a phosphono-propyl group, a p-phosphonobenzylaminocarbonylethyl group, a phosphonate methyl group, a phosphonate propyl group, a phosphonate butyl group, a p-phosphonate benzylaminocarbonylethyl group, a vinyl group and an ethynyl group.

Preferred examples of $R^5$, $R^6$, $R^8$, $R^9$, $R^{10}$ and $R^{11}$ in partial structural formulae (A-1) and (A-2) are described below in detail.

The halogen atom is preferably a fluorine atom, a chlorine atom, a bromine atom or a iodine atom.

Preferred examples of the alkyl group, the substituted alkyl group, the aryl group, the substituted aryl group, the alkenyl group and the substituted alkenyl group include those described above for $R^4$ and $R^7$.

The substituted oxy group ($R^{17}O$—) includes those where $R^{17}$ is a monovalent nonmetallic atom group exclusive of hydrogen. Preferred examples of the substituted oxy group include an alkoxy group, an aryloxy group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonoxy group and a phosphonatoxy group. The alkyl group and the aryl group in these groups include those described above for the alkyl group and the substituted alkyl group and those for the aryl group and the substituted aryl group, respectively. The acyl group ($R^{18}CO$—) in the acyloxy group include those where $R^{18}$ is the alkyl group, substituted alkyl group, aryl group or substituted aryl group described above for $R^4$ and $R^7$. Among these substituents, more preferred are an alkoxy group, an aryloxy group, an acyloxy group and an arylsulfoxy group. Preferred specific examples of the substituted oxy group include a methoxy group, an ethoxy group, a propyloxy group, an isopropyloxy group, a butyloxy group, a pentyloxy group, a hexyloxy group, a dodecyloxy group, a benzyloxy group, an allyloxy group, a phenethyloxy group, a carboxyethyloxy group, a methoxycarbonylethyloxy group, an ethoxycarbonylethyloxy group, a methoxyethoxy group, a phenoxyethoxy group, a methoxyethoxyethoxy group, an ethoxyethoxyethoxy group, a morpholinoethoxy group, a morpholinopropyloxy group, an allyloxyethoxyethoxy group, a phenoxy group, a tolyloxy group, a xylyloxy group, a mesityloxy group, a cumenyloxy group, a methoxyphenyloxy group, an ethoxy-phenyloxy group, a chlorophenyloxy group, a bromophenyloxy group, an acetyloxy group, a benzoyloxy group, a naphthyloxy group, a phenylsulfonyloxy group, a phosphonoxy group and a phosphonatoxy group.

The substituted thio group ($R^{19}S$—) includes those where $R^{19}$ is a monovalent nonmetallic atom group exclusive of hydrogen. Preferred examples of the substituted thio group include an alkylthio group, an arylthio group, an alkyldithio group, an aryldithio group and an acylthio group. The alkyl group and the aryl group in these groups include those described above for the alkyl group and the substituted alkyl group and those for the aryl group and the substituted aryl group, respectively. $R^{18}$ of the acyl group ($R^{18}CO$—) in the acylthio group is the same as described above. Among these, an alkylthio group and an arylthio group are more preferred. Preferred specific examples of the substituted thio group include a methylthio group, an ethylthio group, a phenylthio group, an ethoxyethylthio group, a carboxyethylthio group and a methoxycarbonylthio group.

The substituted amino group ($R^{20}NH$—, ($R^{21}$)($R^{22}$)N—) includes those where $R^{20}$, $R^{21}$ and $R^{22}$ are each a monovalent nonmetallic atom group exclusive of hydrogen. Preferred examples of the substituted amino group include an N-alkylamino group, an N,N-dialkylamino group, an N-arylamino group, an N,N-diarylamino group, an N-alkyl-N-arylamino group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-aryl-ureido group, an alkoxycarbonylamino group, an aryloxy-carbonylamino group, an N-alkyl-N-alkoxycarbonylamino group, an N-alkyl-N-aryloxycarbonylamino group, an N-aryl-N-alkoxycarbonylamino group and an N-aryl-N-aryloxycarbonylamino group. The alkyl group and the aryl group in these groups include those described above for the alkyl group and the substituted alkyl group and those for the aryl group and the substituted aryl group, respectively, and $R^{18}$ of the acyl group ($R^{18}CO$—) in the acylamino group, the N-alkylacylamino group and the N-arylacylamino group is the same as described above. Among these, more preferred are an N-alkylamino group, an N,N-dialkylamino group, an N-arylamino group and an acylamino group. Preferred specific examples of the substituted amino group include a methylamino group, an ethylamino group, a diethylamino group, a morpholino group, a piperidino group, a pyrrolidino group, a phenylamino group, a benzoylamino group and an acetylamino group.

The substituted carbonyl group ($R^{23}$—Co—) includes those where $R^{23}$ is a monovalent nonmetallic atom group. Preferred examples of the substituted carbonyl group include a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group and an N-alkyl-N-arylcarbamoyl group. The alkyl group and the aryl group in these groups include those described above for the alkyl group and the substituted alkyl group and those for the aryl group and the substituted aryl group, respectively. Among these, more preferred are a formyl group, an acyl group, a carboxyl group, an alkoxycarbonyl group, an aryloxycarbonyl group, a carbamoyl group, an N-alkylcarbamoyl group, an N,N-dialkylcarbamoyl group and an N-arylcarbamoyl group, still more preferred are a formyl group, an acyl group, an alkoxycarbonyl group and an aryloxycarbonyl group. Specific examples of preferred substituents include a formyl group, an acetyl group, a benzoyl group, a carboxyl group, a methoxycarbonyl group, an allyloxycarbonyl group, an N-methylcarbamoyl group, an N-phenylcarbamoyl group, an N,N-diethylcarbamoyl group and a morpholinocarbonyl group.

The substituted sulfinyl group ($R^{24}$—SO—) includes those where $R^{24}$ is a monovalent nonmetallic atom group. Preferred examples thereof include an alkylsulfinyl group, an aryl-sulfinyl group, a sulfinamoyl group, an N-alkylsulfinamoyl group, an N,N-dialkylsulfinamoyl group, an N-arylsulfinamoyl group, an N,N-diarylsulfinamoyl group and an N-alkyl-N-arylsulfinamoyl group. The alkyl group and the aryl group in these groups include those described above for the alkyl group and the substituted alkyl group and those for the aryl group and the substituted aryl group, respectively. Among these, more preferred are an alkylsulfinyl group and an arylsulfinyl group. Specific examples of the substituted sulfinyl group include a hexylsulfinyl group, a benzylsulfinyl group and a tolylsulfinyl group.

The substituted sulfonyl group ($R^{25}$—SO$_2$—) include those where $R^{25}$ is a monovalent nonmetallic atom group. More preferred examples thereof include an alkylsulfonyl group and an arylsulfonyl group. The alkyl group and the aryl group in these groups include those described above for the alkyl group and the substituted alkyl group and those for the aryl group and the substituted aryl group, respectively. Specific examples of the substituted sulfonyl group include a butylsulfonyl group and a chlorophenylsulfonyl group.

The sulfonate group (—SO$_3^-$) means a conjugate base anion group of a sulfo group (-SO$_3$H) as described above and it is preferably used in combination with a counter cation. The counter cation includes commonly known cations, more specifically, various oniums (e.g., ammoniums, sulfoniums, phosphoniums, iodoniums, aziniums) and metal ions (e.g., Na$^+$, K$^+$, Ca$^{2+}$, Zn$^{2+}$)

The substituted phosphono group means a substituent group resulting from substitution for one or two hydroxyl groups on the phosphono group by other organic oxo groups. Preferred examples thereof include a dialkylphosphono group, a diarylphosphono group, an alkylarylphosphono group, a monoalkylphosphono group and a monoarylphosphono group. Among these, preferred are a dialkylphosphono group and a diarylphosphono group. Specific examples thereof include a diethylphosphono group, a dibutylphosphono group and a diphenylphosphono group.

The phosphonate group (—PO$_3^{2-}$, —PO$_3$H$^-$) means a conjugate base anion group resulting from acid first dissociation or acid second dissociation of a phosphono group (—PO$_3$H$_2$). It is usually used preferably in combination with a counter cation. The counter cation includes commonly known cations, more specifically, various oniums (e.g., ammoniums, sulfoniums, phosphoniums, iodoniums, aziniums) and metal ions (e.g., Na$^+$, K$^+$, Ca$^{2+}$, Zn$^{2+}$)

The substituted phosphonate group is a conjugate base anion group of the above-described substituted phosphono groups where one hydroxyl group is substituted for by an organic oxo group. Specific examples thereof include a conjugate base of a monoalkylphosphono group (—PO$_3$H (alkyl)) and a conjugate base of a monoarylphosphono group (—PO$_3$H(aryl)). The conjugate base is preferably used in combination with a counter cation. The counter cation includes commonly known cations, more specifically, various oniums (e.g., ammoniums, sulfoniums, phosphoniums, iodoniums, aziniums) and metal ions (e.g., Na$^+$, K$^+$, Ca$^{2+}$, Zn$^{2+}$)

The silyl group (($R^{26}$)($R^{27}$)($R^{28}$)Si—) includes those where $R^{26}$, $R^{27}$ and $R^{28}$ are each a monovalent nonmetallic atom group. Preferred examples thereof include those described above for the alkyl group, the substituted alkyl group, the aryl group and the substituted aryl group. Preferred examples of the silyl group include a trimethylsilyl group, a tributylsilyl group, a t-butyldimethylsilyl group and a dimethylphenylsilyl group.

Among those described for $R^5$, $R^6$, $R^8$, $R^9$, $R^{10}$ and $R^{11}$, more preferred are a hydrogen atom, a halogen atom (—F, —Cl, —Br, —I), an alkyl group, a substituted alkyl group, an aryl group, a substituted aryl group, a substituted oxy group, a substituted thio group, a substituted amino group, a substituted carbonyl group, a sulfo group, a sulfonate group and a cyano group, still more preferred are a hydrogen atom, an alkyl group, a substituted alkyl group, an aryl group and a substituted carbonyl group.

The ring formed by combining $R^5$ and $R^6$, $R^8$ and $R^9$, $R^8$ and $R^{10}$, $R^9$ and $R^{11}$, or $R^{10}$ and $R^{11}$ with each other is described below. The ring formed by combining $R^5$ and $R^6$, $R^8$ and $R^9$, $R^8$ and $R^{10}$, $R^9$ and $R^{11}$, or $R^{10}$ and $R^{11}$ with each other is a saturated or unsaturated aliphatic ring, more preferably a 5-, 6-, 7- or 8-membered aliphatic ring formed together with the carbon atoms to which each couple is bonded, still more preferably a 5- or 6-membered aliphatic ring. The ring may have a substituent on the carbon atom constituting the ring (examples of the substituent include substituents described above for the substituted alkyl group as an example of $R^4$ and $R^7$) or a part of the ring-constituting carbons may be substituted by a hetero atom (e.g., oxygen atom, sulfur atom, nitrogen atom). Preferred specific examples of the ring include a cyclopentane ring, a cyclohexane ring, a cycloheptane ring, a cyclooctane ring, a cyclo-1,3-dioxapentane ring, a cyclopentene ring, a cyclohexene ring, a cycloheptene ring, a cyclooctene ring, a cyclo-1,3-dioxapentene ring, a cyclo-1,3-dioxahexene ring, a cyclohexadiene ring, a benzocyclohexene ring and a benzo- cyclohexadiene ring.

Preferred specific examples of (A-1) and (A-2) are set forth below.

|  | $R^4$ | $R^5$ | $R^6$ |
|---|---|---|---|
| (a-1) | —CH$_3$ | —H | —H |
| (a-2) | —C$_4$H$_9$ | —CH$_3$ | —H |
| (a-3) | —C$_5$H$_{11}$ | —CH$_3$ | —CH$_3$ |
| (a-4) | —C$_6$H$_{13}$ | —Ph | —H |
| (a-5) | —C$_7$H$_{15}$ | —H | —Ph |
| (a-6) | —C$_8$H$_{17}$ | —Ph | —Ph |

-continued

| | | | |
|---|---|---|---|
| (a-7) | $-C_{10}H_{21}$ | 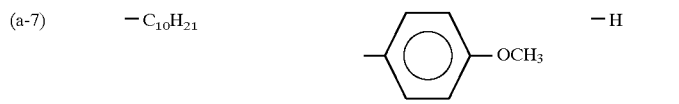 | $-H$ |
| (a-8) | $-C_{18}H_{37}$ | $-CO_2CH_3$ | $-H$ |
| (a-9) | $-CH_2-CH=CH_2$ | $-CO_2CH_3$ | $-CO_2CH_3$ |
| (a-10) | $-CH_2Ph$ | $-CH_3$ | $-H$ |
| (a-11) | $-CH_2CO_2H$ | $-CH_3$ | $-H$ |
| (a-12) | $-(CH_2)_2CO_2H$ | $-CH_3$ | $-CH_3$ |
| (a-13) | $-(CH_2)_4SO_3^e$ | $-C_2H_5$ | $-H$ |
| (a-14) | $-(CH_2)_2O-(CH_2)_2OCH_3$ | $-CH_2I$ | $-H$ |
| (a-15) | $-(CH_2)_2PO_3H_2$ | $-Cl$ | $-NO_2$ |
| (a-16) | $-(CH_2)_2Ph$ | $-F$ | $-H$ |
| (a-17) | $-Ph$ | $-CH_3$ | $-H$ |
| (a-18) | 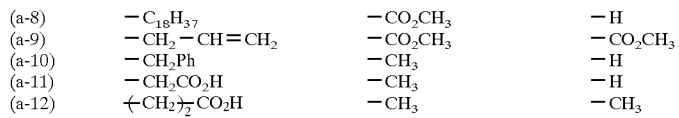 | $-CH_3$ | $-CH_3$ |

| (a-19) | (a-20) | (a-21) |
|---|---|---|

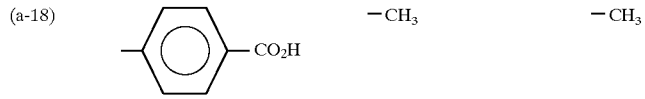

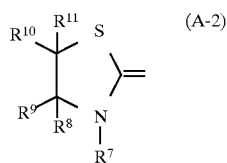

(A-2)

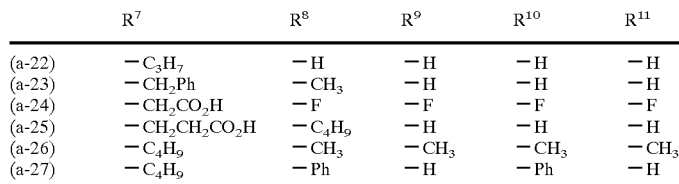

| | $R^7$ | $R^8$ | $R^9$ | $R^{10}$ | $R^{11}$ |
|---|---|---|---|---|---|
| (a-22) | $-C_3H_7$ | $-H$ | $-H$ | $-H$ | $-H$ |
| (a-23) | $-CH_2Ph$ | $-CH_3$ | $-H$ | $-H$ | $-H$ |
| (a-24) | $-CH_2CO_2H$ | $-F$ | $-F$ | $-F$ | $-F$ |
| (a-25) | $-CH_2CH_2CO_2H$ | $-C_4H_9$ | $-H$ | $-H$ | $-H$ |
| (a-26) | $-C_4H_9$ | $-CH_3$ | $-CH_3$ | $-CH_3$ | $-CH_3$ |
| (a-27) | $-C_4H_9$ | $-Ph$ | $-H$ | $-Ph$ | $-H$ |

| (a-28) | (a-29) |
|---|---|

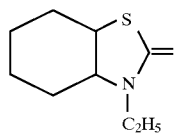 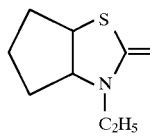

| (a-30) | (a-31) |
|---|---|

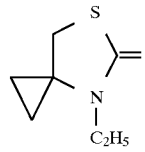 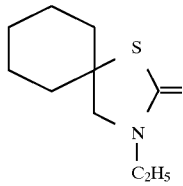

Preferred examples of —X— and $R^1$ in formula (I) are described below. —X— represents —O—, —S—, —NR$^2$— or -CONR$^3$- and forms a nitrogen-containing 5- or 6-membered ring. Preferred examples of the alkyl group, the substituted alkyl group, the aryl group, the substituted aryl group, the alkenyl group, the substituted alkenyl group, the alkynyl group and the substituted alkynyl group for the substituents $R^1$, $R^2$ and $R^3$ on the nitrogen atom of the ring include those described above for $R^4$ and $R^7$ in partial structural formulae (A-1) and (A-2). —X— is preferably —O—, —S— or —NR$^2$—, more preferably —S— or —NR$^2$—, and most preferably —S—.

The substituted or unsubstituted 1,3-dihydro-1-oxo-2H-inden-2-ylidene group for =E in formula (I) is represented by the following partial structural formula (B):

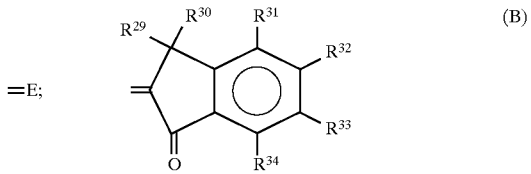

wherein $R^{29}$, $R^{30}$, $R^{31}$, $R^{32}$, $R^{33}$ and $R^{34}$ each independently represents a monovalent nonmetallic atom group, preferably a hydrogen atom, a halogen atom, an alkyl group, a substituted alkyl group, an aryl group, a substituted aryl group, an alkenyl group, a substituted alkenyl group, a hydroxyl group, a substituted oxy group, a mercapto group, a substituted thio group, an amino group, a substituted amino group, a substituted carbonyl group, a sulfo group, a sulfonate group, a substituted sulfinyl group, a substituted sulfonyl group, a phosphono group, a substituted phosphono group, a phosphonate group, a substituted phosphonate group, a cyano group, a nitro group or a silyl group. Preferred examples of the substituent in these groups include those described above for $R^5$, $R^6$, $R^8$, $R^9$, $R^{10}$ and $R^{11}$ in partial structural formulae (A-1) and (A-2).

$R^{29}$ and $R^{30}$ may be combined with each other to form an aliphatic ring to thereby form a spiro ring together with the ring containing the carbon atoms to which $R^{29}$ and $R^{30}$ are bonded. The aliphatic ring is preferably a 5-, 6-, 7- or 8-membered aliphatic ring, more preferably a 5- or 6-membered aliphatic ring. Further, the ring may have a substituent on the carbon atom constituting the ring (examples of the substituent include substituents described above for the substituted alkyl group as an example of $R^4$ and $R^7$) and a part of the ring-constituting carbon atoms may be substituted by a hetero atom (e.g., oxygen atom, sulfur atom, nitrogen atom). Preferred specific examples of the ring include a cyclopentane ring, a cyclohexane ring, a cycloheptane ring, a cyclooctane ring, a cyclo-1,3-dioxapentane ring, a cyclo-1,3-dioxapentane ring, a cyclopentene ring, a cyclohexene ring, a cycloheptene ring, a cyclooctene ring, a cyclo-1,3-dioxapentene ring and a cyclo-1,3-dioxahexene ring.

$R^{31}$ and $R^{32}$, $R^{32}$ and $R^{33}$, or $R^{33}$ and $R^{34}$ may be suitably combined with each other to form an aliphatic or aromatic ring. The aliphatic ring is a 5-, 6-, 7- or 8-membered aliphatic ring, preferably a 5- or 6-membered aliphatic ring. Further, the aliphatic ring may have a substituent on the carbon atom constituting the ring (examples of the substituent include substituents described above for the substituted alkyl group as an example of $R^4$ and $R^7$) or a part of the ring-constituting carbon atoms may be substituted by a hetero atom (e.g., oxygen atom, sulfur atom, nitrogen atom). Preferred specific examples of the ring include a benzocyclopentene ring, a banzo-cyclohexene ring, a benzocycloheptene ring, a benzocyclooctene ring, a 1,3-benzocyclohexadiene ring, a 1,3-dihydro-1,3-dioxaindene ring and a durolidine ring each formed in cooperation with the benzene ring containing the carbon atoms to which each coupler is bonded in formula (B). The aromatic ring is a naphthalene ring or an anthracene ring formed in cooperation with the benzene ring containing the carbon atoms to which each couple is bonded and it is preferably a naphthalene ring. The aromatic ring may have a substituent on the carbon atom constituting the ring (examples of the substituent include substituents described above for the substituted alkyl group as an example of $R^4$ and $R^7$).

$R^{29}$ and $R^{30}$ are each more preferably a hydrogen atom, a halogen atom, an alkyl group, a substituted alkyl group, an aryl group, a substituted aryl group or a substituted carbonyl group. $R^{31}$, $R^{32}$, $R^{33}$ and $R^{34}$ are each more preferably a hydrogen atom, a halogen atom, an alkyl group, a substituted alkyl group, an aryl group, a substituted aryl group, a hydroxyl group, a substituted oxy group, a mercapto group, a substituted thio group, an amino group, a substituted amino group or a substituted carbonyl group.

Specific preferred examples of partial structural formula (B) are set forth below.

Partial structure (B)

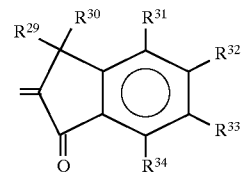

|  | $R^{29}$ | $R^{30}$ | $R^{31}$ | $R^{32}$ | $R^{33}$ | $R^{34}$ |
|---|---|---|---|---|---|---|
| (b-1) | —H | —H | —H | —H | —H | —H |
| (b-2) | —CH$_3$ | —H | —H | —H | —H | —H |
| (b-3) | —CH$_3$ | —CH$_3$ | —H | —H | —H | —H |
| (b-4) | —Ph | —H | —H | —H | —H | —H |
| (b-5) | —Ph | —H | —H | —H | —OCH$_3$ | —H |
| (b-6) | —Ph | —H | —H | —OCH$_3$ | —OCH$_3$ | —H |
| (b-7) | —Ph | —H | —H | —OCH$_3$ | —OCH$_3$ | —OCH$_3$ |
| (b-8) | —Ph | —H | —OCH$_3$ | —H | —H | —OCH$_3$ |
| (b-9) | —Ph | —H | —CH$_3$ | —H | —H | —CH$_3$ |

-continued

Partial structure (B)

$$\text{Structure with } R^{29}, R^{30} \text{ on sp}^3 \text{ carbon of indanone; } R^{31}, R^{32}, R^{33}, R^{34} \text{ on benzene ring; C=O at position 1, =CH}_2 \text{ exocyclic}$$

| | $R^{29}$ | $R^{30}$ | $R^{31}$ | $R^{32}$ | $R^{33}$ | $R^{34}$ |
|---|---|---|---|---|---|---|
| (b-10) | 4-CF$_3$-C$_6$H$_4$- | —H | —H | —H | —H | —H |
| (b-11) | 4-F-C$_6$H$_4$- | —H | —H | —H | —H | —H |
| (b-12) | 4-Cl-C$_6$H$_4$- | —H | —H | —H | —H | —H |
| (b-13) | 4-OCH$_3$-C$_6$H$_4$- | —H | —H | —H | —H | —H |
| (b-14) | 4-N(CH$_3$)$_2$-C$_6$H$_4$- | —H | —H | —H | —H | —H |
| (b-15) | 3,4-(OCH$_3$)$_2$-C$_6$H$_3$- | —H | —H | —H | —H | —H |
| (b-16) | —Cl | —Cl | —H | —H | —H | —H |
| (b-17) | —C(CH$_3$)$_3$ | —H | —H | —H | —H | —H |
| (b-18) | —CH(CH$_3$)$_2$ | —H | —CH$_3$ | —H | —H | —H |
| (b-19) | —H | —H | —CH$_3$ | —H | —H | —H |
| (b-20) | —H | —H | —H | —CH$_3$ | —H | —H |
| (b-21) | —H | —H | —H | —H | —CH$_3$ | —H |
| (b-22) | —H | —H | —H | —H | —H | —CH$_3$ |
| (b-23) | —CH$_3$ | —H | —H | —H | —CH$_3$ | —H |
| (b-24) | —H | —H | —H | —H | —C(CH$_3$)$_3$ | —H |
| (b-25) | —H | —H | —OCH$_3$ | —H | —CH(CH$_3$)$_2$ | —H |
| (b-26) | —H | —H | —CH(CH$_3$)$_2$ | —H | —H | —CH$_3$ |
| (b-27) | —CH$_3$ | —CH$_3$ | —H | —C$_2$H$_5$ | —H | —H |
| (b-28) | —CH$_2$Ph | —H | —H | —CH$_3$ | —H | —H |
| (b-29) | —H | —H | —H | —CH$_3$ | —CH$_3$ | —H |
| (b-30) | —H | —H | —CH$_3$ | —H | —H | —CH$_3$ |
| (b-31) | —Ph | —CH$_3$ | —H | —H | —H | —H |
| (b-32) | —CH$_3$ | —CH$_3$ | —H | —CH$_3$ | —CH$_3$ | —CH$_3$ |
| (b-33) | —CH$_3$ | —CH$_3$ | —CH$_3$ | —CH$_3$ | —H | —CH$_3$ |
| (b-34) | —CH$_3$ | —CH$_3$ | —CH$_3$ | —H | —H | —CH$_3$ |
| (b-35) | —H | —H | —H | —CH$_3$ | —H | —CH$_3$ |
| (b-36) | —H | —H | —CH$_3$ | —H | —H | —CH(CH$_3$); |
| (b-37) | —H | —H | —Cl | —H | —H | —H |
| (b-38) | —H | —H | —H | —Cl | —H | —H |
| (b-39) | —H | —H | —H | —H | —Cl | —H |
| (b-40) | —CH$_3$ | —H | —H | —Cl | —H | —H |
| (b-41) | —H | —H | —Cl | —H | —H | —CH$_3$ |
| (b-42) | —H | —H | —CH$_3$ | —H | —H | —Cl |
| (b-43) | —H | —H | —Br | —H | —H | —H |
| (b-44) | —H | —H | —H | —Br | —H | —H |
| (b-45) | —H | —H | —H | —H | —I | —H |
| (b-46) | —H | —H | —CH(CH$_3$)$_2$ | —H | —H | —Br |
| (b-47) | —H | —H | —Br | —H | —H | —CH(CH$_3$); |
| (b-48) | —H | —H | —CH$_3$ | —H | —H | —Br |
| (b-49) | —H | —H | —Br | —H | —H | —CH$_3$ |

-continued

Partial structure (B)

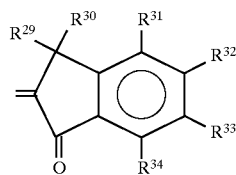

| | $R^{29}$ | $R^{30}$ | $R^{31}$ | $R^{32}$ | $R^{33}$ | $R^{34}$ |
|---|---|---|---|---|---|---|
| (b-50) | —H | —H | —OH | —H | —H | —H |
| (b-51) | —H | —H | —H | —OH | —H | —H |
| (b-52) | —H | —H | —OC$_2$H$_5$ | —H | —H | —H |
| (b-53) | —H | —H | —H | —OCH$_3$ | —H | —H |
| (b-54) | —H | —H | —H | —H | —OCH$_3$ | —H |
| (b-55) | —H | —H | —OCH$_3$ | —OCH$_3$ | —H | —H |
| (b-56) | —H | —H | —H | —OCH$_3$ | —OCH$_3$ | —H |
| (b-57) | —H | —H | —H | —OCH$_3$ | —H | —OCH$_3$ |
| (b-58) | —H | —H | —OCH$_3$ | —OCH$_3$ | —OCH$_3$ | —H |
| (b-59) | —H | —H | —OCH$_3$ | —H | —OCH$_3$ | —OCH$_3$ |
| (b-60) | —H | —H | —OH | —H | —H | —OH |
| (b-61) | —H | —H | —H | —N(CH$_3$)$_2$ | —H | —H |
| (b-62) | —H | —H | —H | —SCH$_3$ | —H | —H |
| (b-63) | —H | —H | —H | —OC$_2$H$_5$CO$_2$H | —H | —H |
| (b-64) | —H | —H | —H | —OC$_2$H$_5$CO$_2$CH$_3$ | —H | —H |
| (b-65) | —H | —H | —H | —H | —CO$_2$H | —H |
| (b-66) | —H | —H | —H | —H | —CO$_2$C$_2$H$_5$ | —H |
| (b-67) | —H | —H | —H | —Ph | —H | —H |
| (b-68) | —H | —H | —NO$_2$ | —H | —H | —H |
| (b-69) | —CH$_3$ | —CH$_3$ | —H | —H | —NO$_2$ | —H |
| (b-70) | —CO$_2$H | —H | —H | —H | —H | —H |
| (b-71) | —CH$_2$CO$_2$H | —H | —H | —H | —H | —H |
| (b-72) | —CO$_2$C$_2$H$_5$ | —H | —H | —H | —H | —H |

(b-73)

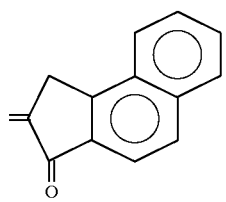

(b-74)

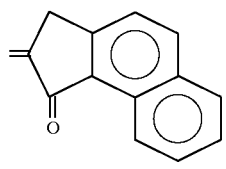

(b-75)

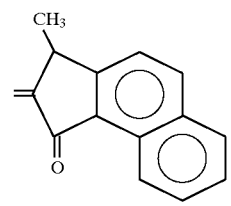

(b-76)

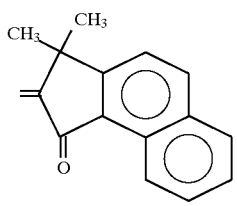

(b-77)

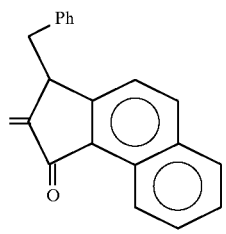

(b-78)

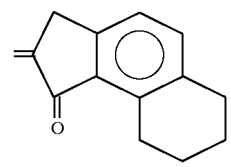

(b-79)

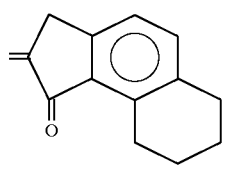

(b-80)

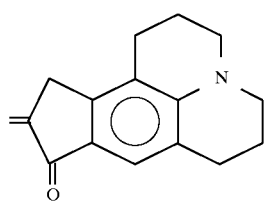

(b-81)

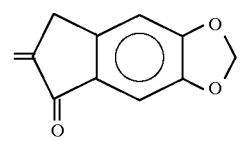

(b-82)

(b-83)

-continued

Partial structure (B)

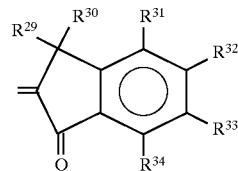

| $R^{29}$ | $R^{30}$ | $R^{31}$ | $R^{32}$ | $R^{33}$ | $R^{34}$ |
|---|---|---|---|---|---|
| 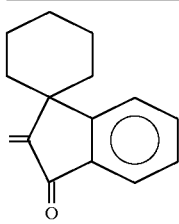 | 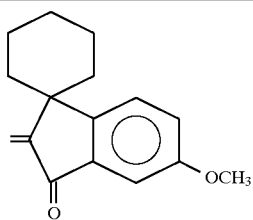 | | | | |

The compound represented by formula (I) is constituted by combining in sequence the partial structure A=represented by partial structural formula (A-1) or (A-2) with the partial structure =E represented by partial structural formula (B). Preferred specific examples of the compound represented by formula (I) are set forth below.

| | $R^4$ | $R^5$ | $R^6$ | $R^1$ | -X- | $R^{29}$ | $R^{30}$ | $R^{31}$ | $R^{32}$ | $R^{33}$ | $R^{34}$ |
|---|---|---|---|---|---|---|---|---|---|---|---|
| (I-1) | $-C_4H_9$ | $-CH_3$ | $-H$ | $-C_2H_5$ | $-S-$ | $-H$ | $-H$ | $-H$ | $-H$ | $-H$ | $-H$ |
| (I-2) | $-C_4H_9$ | $-CH_3$ | $-H$ | $-CH_2CH=CH_2$ | $-S-$ | $-Ph$ | $-H$ | $-H$ | $-H$ | $-H$ | $-H$ |
| (I-3) | $-C_3H_7$ | $-H$ | $-CH_3$ | $-CH_3$ | $-S-$ | $-H$ | $-H$ | $-H$ | $-H$ | $-OCH_3$ | $-H$ |
| (I-4) | $-CH_2-CH=CH_2$ | $-CH_3$ | $-CH_3$ | $-CH_2Ph$ | $-S-$ | $-CH_3$ | $-H$ | $-H$ | $-H$ | $-H$ | $-H$ |
| (I-5) | $-CH_2-Ph$ | $-CH_3$ | $-CH_3$ | $-CH_2CO_2H$ | $-S-$ | $-CH_3$ | $-CH_3$ | $-H$ | $-H$ | $-H$ | $-H$ |
| (I-6) | $-C_2H_5$ | $-Ph$ | $-H$ | $-C_2H_5$ | $-S-$ | 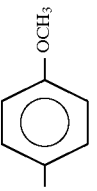 | $-H$ | $-H$ | $-OCH_3$ | $-OCH_3$ | $-H$ |
| (I-7) | $-C_2H_5$ | $-Ph$ | $-Ph$ | $-C_2H_5$ | $-S-$ | 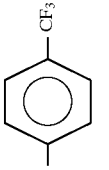 | $-H$ | $-H$ | $-OCH_3$ | $-OCH_3$ | $-H$ |
| (I-8) | $-C_3H_7$ | $-H$ | $-CH_3$ | $-CH_2CH=CH_2$ | $-S-$ | 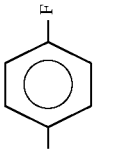 | $-H$ | $-H$ | $-OCH_3$ | $-OCH_3$ | $-OCH_3$ |

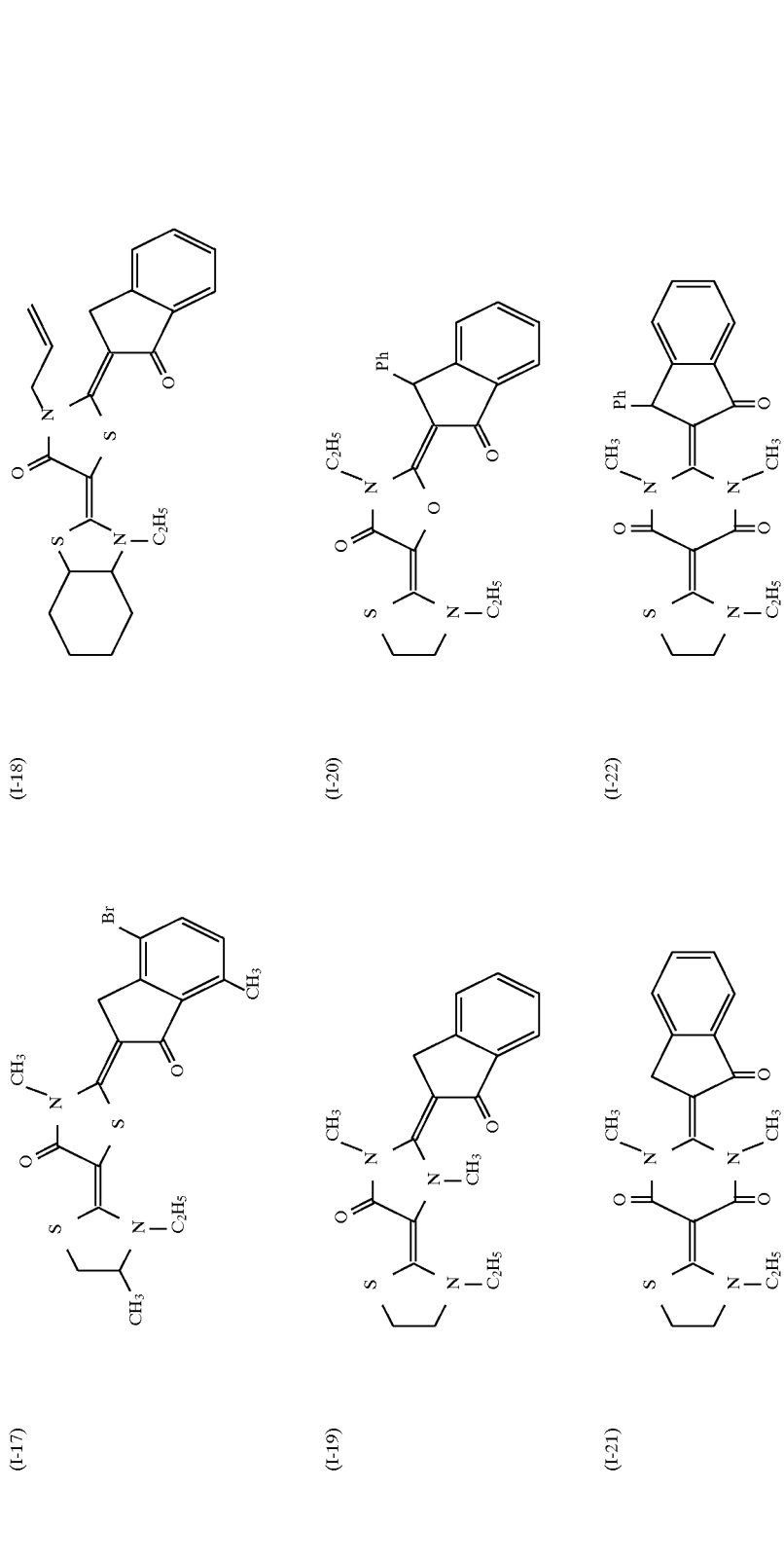

The compounds represented by formula (I) can be synthesized according to the methods described in *Bull. Soc. Chimie. Belges*, "Abstract", Vol. 57, pp. 364–372 (1948) and *Chemical Abstracts*, Vol. 44, columns 60c to 61d (1950). More specifically, for example, Compound (I-1) can be produced by condensing 5-[3-butyl-4-methyl-2(1H)-thiazolylidene]-4,5-dihydro-3-ethyl-2-(methylthio)-4-oxothiazolium 4-methyl-benzenesulfonate to 1-indanone under basic conditions. In this case, the base used may be a general-purpose base in a common use and for example, an organic amine, pyridines (e.g., trialkylamine, dimethylaminopyridine), metal amides (e.g., lithium diisopropylamide), metal alkoxides (e.g., sodium methoxide, potassium t-butoxide) and metal hydrides (e.g., sodium hydride) may be used suitably. The synthesis method of the compound represented by formula (I) is by no means limited to the above-described methods.

The compounds represented by formula (I) for use in the photopolymerizable composition of the present invention are suitably used individually or in combination of two or more thereof.

The component (iii) for use in the present invention is described below in detail. The compound as component (iii) of the present invention may be any as long as it produces an active radical upon light irradiation in the presence of component (ii) together. More specifically, a compound which produces an active radical through an interaction (e.g., energy transfer, electron transfer, production of excited complex) with component (ii) excited by the light irradiation can be suitably used. Examples of preferred activators include (a) a compound having a carbon halogen bond, (b) an aromatic onium salt compound, (c) an organic peroxide compound, (d) a thio compound, (e) a hexaarylbiimidazole compound, (f) a ketooxime ester compound, (g) a borate compound, (h) an azinium compound, (i) a metallocene compound and (j) an active ester compound.

Preferred examples of the compound having a carbon halogen bond as one example of component (iii) include those represented by the following formulae (II), (III), (IV), (V), (VI), (VII) and (VIII):

a compound represented by formula (II):

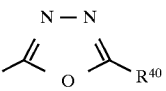
(II)

wherein X represents a halogen atom; $Y^1$ represents $-CX'_3$, $-NH_2$, $-NHR'$, $-NR'_2$ or $-OR'$, in which R' represents an alkyl group, a substituted alkyl group, an aryl group or a substituted aryl group; and R represents $-CX_3$, an alkyl group, a substituted alkyl group, an aryl group, a substituted aryl group or a substituted alkenyl group;

a compound represented by formula (III):

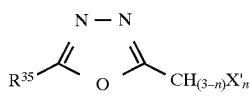
(III)

wherein $R^{35}$ represents an alkyl group, a substituted alkyl group, an alkenyl group, a substituted alkenyl group, an aryl group, a substituted aryl group, a halogen atom, an alkoxy group, a substituted alkoxyl group, a nitro group or a cyano group; X' represents a halogen atom; and n represents an integer of from 1 to 3;

a compound represented by formula (IV):

$$R^{36}-Z-CH_{(2-m)}X''_m-R^{37} \quad (IV)$$

wherein $R^{36}$ represents an aryl group or a substituted aryl group; and $R^{37}$ represents $-C(=O)-NR^{38}R^{39}$, $-C(=S)NR^{38}R^{39}$,

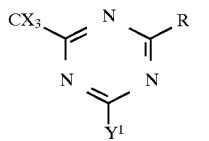

or a halogen, in which $R^{38}$ and $R^{39}$ each represents an alkyl group, a substituted alkyl group, an alkenyl group, a substituted alkenyl group, an aryl group or a substituted aryl group; and $R^{40}$ has the same meaning as R' in formula (II); Z represents $-C(=O)-$, $-C(=S)-$ or $-SO_2-$; X'' represents a halogen atom; and m represents 1 or 2;

a compound represented by formula (V):

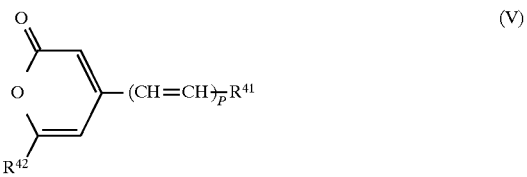
(V)

wherein $R^{41}$ represents an aryl or heterocyclic group which may be substituted; $R^{42}$ represents a trihaloalkyl or trihaloalkenyl group having from 1 to 3 carbon atoms; and p represents 1, 2 or 3 ;

a carbonylmethylene heterocyclic compound having a trihalogenomethyl group represented by formula (VI):

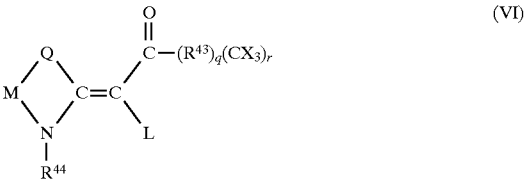
(VI)

wherein L represents a hydrogen atom or a substituent represented by formula: $CO-(R^{43})_q(CX_3)_r$; Q represents a sulfur atom, a selenium atom, an oxygen atom, a dialkylmethylene group, an alken-1,2-ylene group, 1,2-phenylene group or an N—R group; M represents a substituted or unsubstituted alkylene or alkenylene group or a 1,2-arylene group; $R^{44}$ represents an alkyl group, an aralkyl group or an alkoxyalkyl group; $R^{43}$ represents a carbocyclic or heterocyclic divalent aromatic group; X represents a chlorine atom, a bromine atom or an iodine atom; and q=0 and r=1, or q=1 and r=1 or 2;

a 4-halogeno-5-(halogenomethylphenyl)oxazole derivative represented by formula (VII):

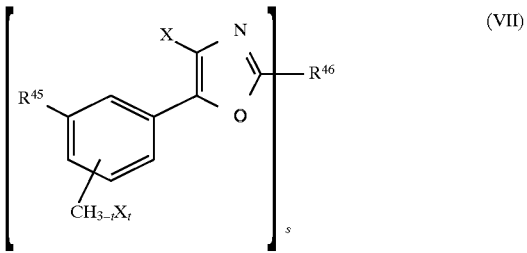
(VII)

wherein X represents a halogen atom; t represents an integer of from 1 to 3; s represents an integer of from 1 to 4; $R^{45}$ represents a hydrogen atom or a $CH_{3-t}X_t$ group; and $R^{46}$ represents an s-valent unsaturated organic group which may be substituted; and a 2-(halogenomethylphenyl)-4-halogenooxazole derivative represented by formula (VIII):

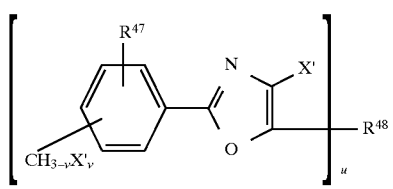

wherein X' represents a halogen atom; v represents an integer of from 1 to 3; u represents an integer of from 1 to 4, $R^{47}$ represents a hydrogen atom or a $CH_{3-v}X'_v$ group; and $R^{48}$ represents a u-valent unsaturated organic group which may be substituted.

Specific examples of the compound having a carbon-halogen bond include:

compounds described, for example, in Wakabayashi et al., Bull. Chem. Soc. Japan, Vol. 42, p. 2924 (1969), such as 2-phenyl-4,6-bis(trichloromethyl)-S-triazine, 2-(p-chloro-phenyl)-4,6-bis(trichloromethyl)-S-triazine, 2-(p-tolyl)- 4,6-bis(trichloromethyl)-S-triazine, 2-(p-methoxyphenyl)-4,6-bis(trichloromethyl)-S-triazine,2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine and 2-(α,α,β-trichloroethyl)-4,6-bis(trichloromethyl)-S-triazine;

compounds described in British Patent 1,388,492 such as 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine and 2-(p-methoxystyryl)-4-amino-6-trichloromethyl-S-triazine;

compounds described in JP-A-53-133428 such as 2-(4-methoxynaphtho-1-yl)-4,6-bis-trichloromethyl-S-triazine, 2-(4-ethoxynaphtho-1-yl)-4,6-bis-trichloromethyl-S-triazine, 2-[4-(2-ethoxyethyl)naphtho-1-yl]-4,6-bis-trichloromethyl-S-triazine, 2-(4,7-dimethoxynaphtho-1-yl)-4,6-bis-trichloro-methyl-S-triazine and 2-(acenaphtho-5-yl)-4,6-bis-trichloromethyl-S-triazine;

compounds described in German Patent No. 3,337,024:

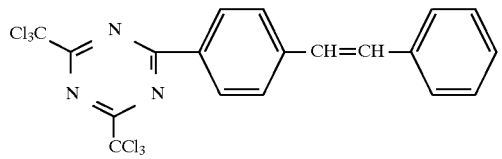

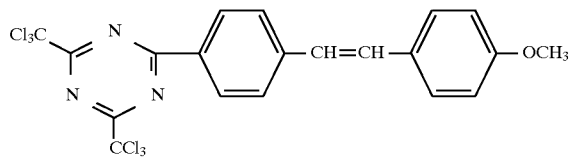

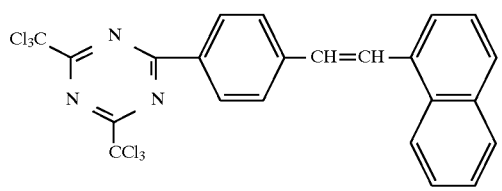

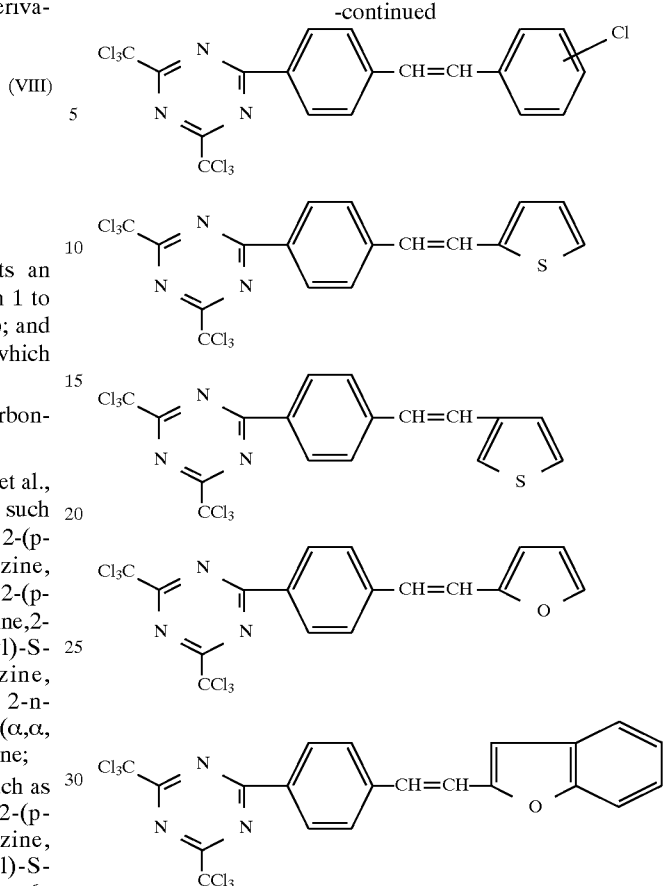

compounds described in F. C. Schaefer et al., J. Org. Chem., Vol. 29, p. 1527 (1964) such as 2-methyl-4,6-bis(tribromomethyl)-S-triazine, 2,4,6-tris(tribromomethyl)-S-triazine, 2,4,5-tris(dibromomethyl)-S-triazine, 2-amino-4-methyl-6-tribromomethyl-S-triazine and 2-methoxy-4-methyl-6-trichloromethyl-S-triazine;

compounds described in JP-A-62-58241:

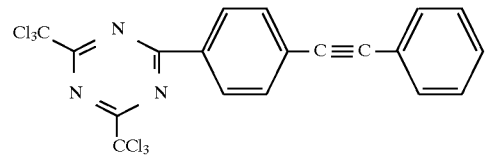

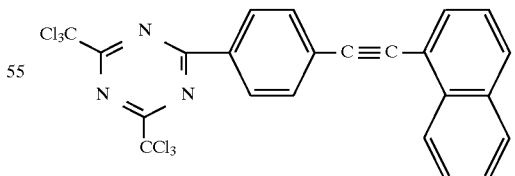

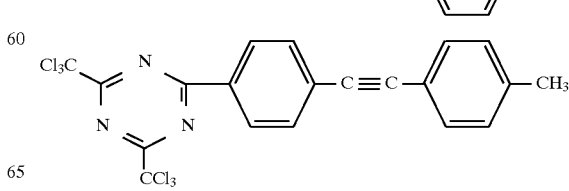

-continued
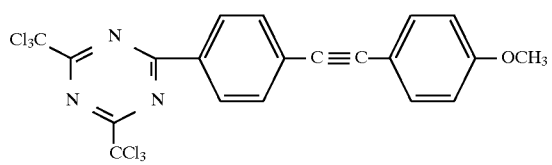
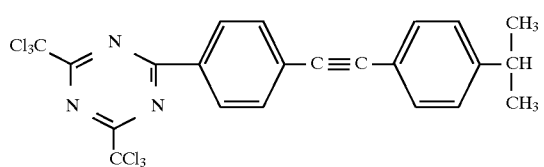
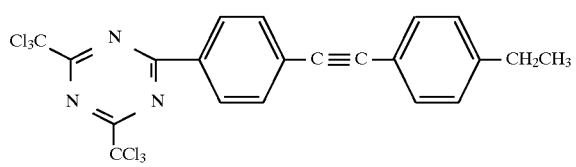
compounds described in JP-A-5-281728:
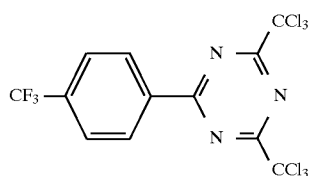
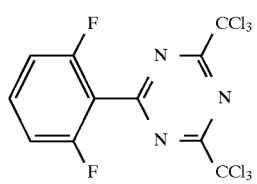
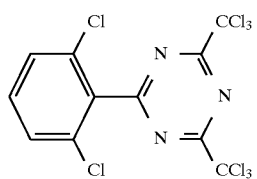
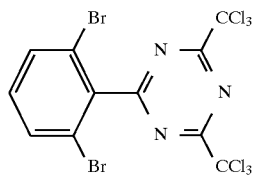
compounds described below which can be easily synthesized by a person skilled in the art according to the synthesis method described in M. P. Hutt, E. F. Elslager and L. M. Merbel, *Journal of Heterocyclic Chemistry*, Vol. 7 (No. 3), page 511 et seq (1970):
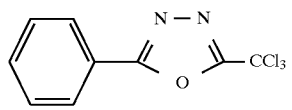
-continued
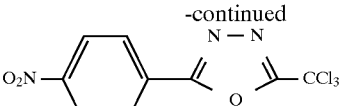
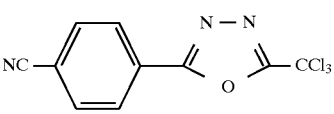
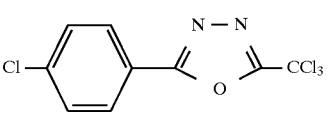
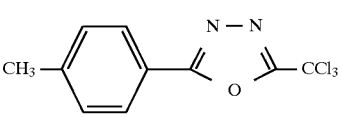
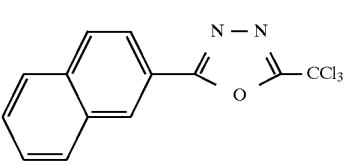
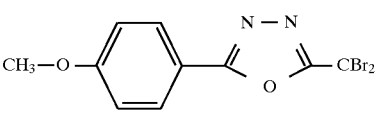
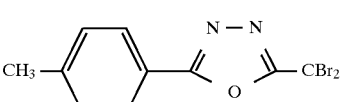
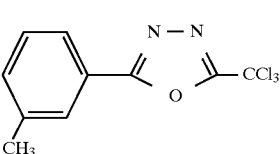
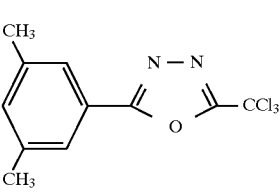
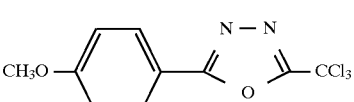
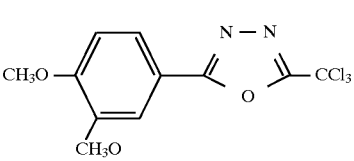
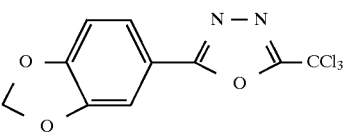

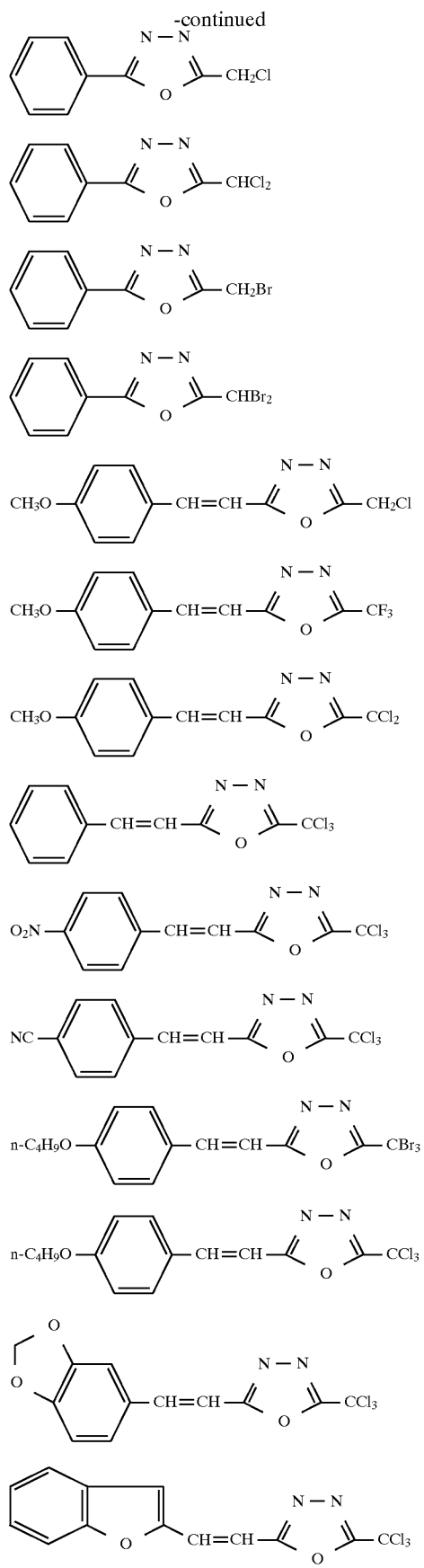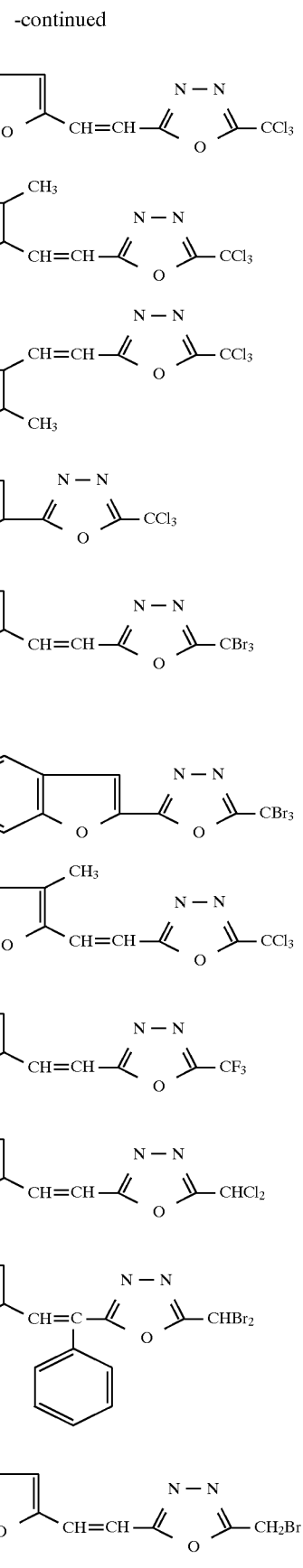

Compounds described below:
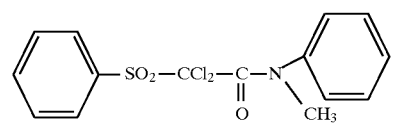 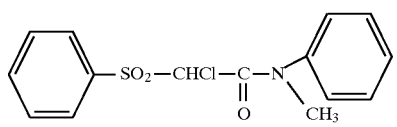
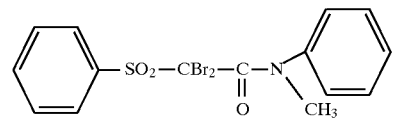 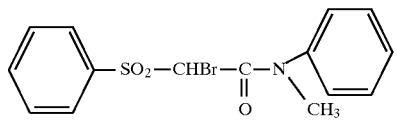
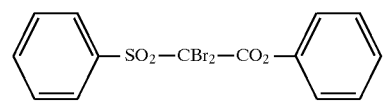 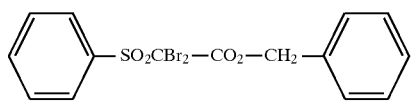
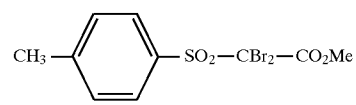 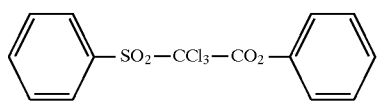
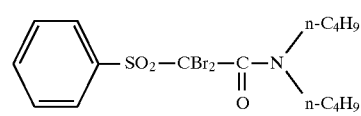 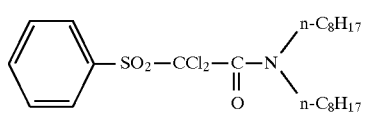
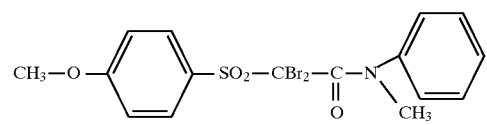 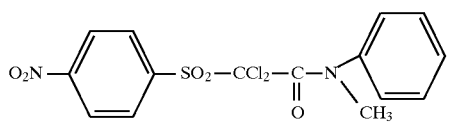
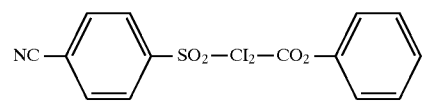 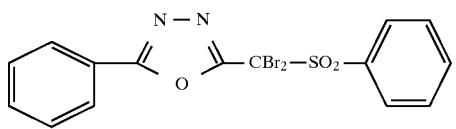
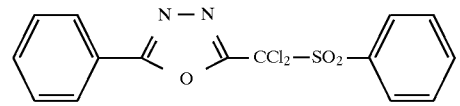
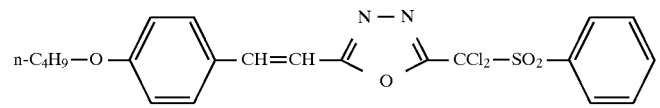
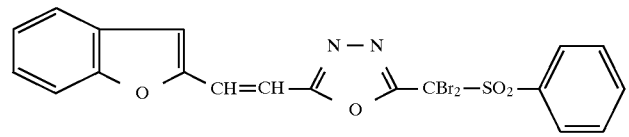
compounds described in German Patent No. 2,641,100 such as 4-(4-methoxystyryl)-6-(3,3,3-trichloropropenyl)-2-pyrone and 4-(3,4,5-trimethoxystyryl)-6-trichloromethyl-2-pyrone;

compounds described in German Patent No. 3,333,450:
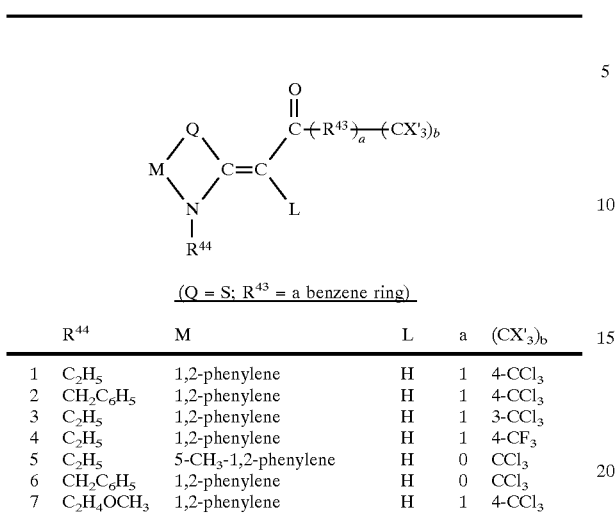
| | $R^{44}$ | M | L | a | $(CX'_3)_b$ |
|---|---|---|---|---|---|
| 1 | $C_2H_5$ | 1,2-phenylene | H | 1 | 4-$CCl_3$ |
| 2 | $CH_2C_6H_5$ | 1,2-phenylene | H | 1 | 4-$CCl_3$ |
| 3 | $C_2H_5$ | 1,2-phenylene | H | 1 | 3-$CCl_3$ |
| 4 | $C_2H_5$ | 1,2-phenylene | H | 1 | 4-$CF_3$ |
| 5 | $C_2H_5$ | 5-$CH_3$-1,2-phenylene | H | 0 | $CCl_3$ |
| 6 | $CH_2C_6H_5$ | 1,2-phenylene | H | 0 | $CCl_3$ |
| 7 | $C_2H_4OCH_3$ | 1,2-phenylene | H | 1 | 4-$CCl_3$ |
compounds described in German Patent No. 3,021,599:
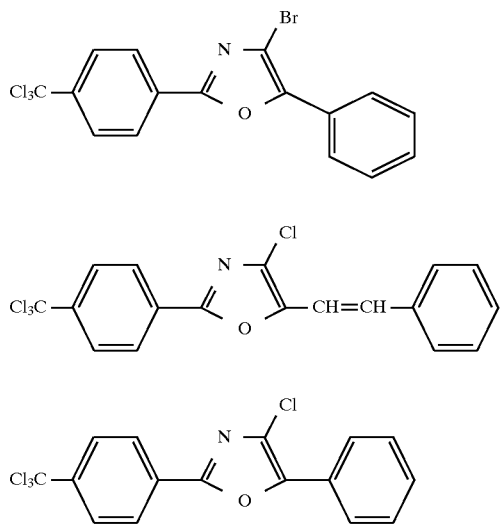
compounds described in German Patent No. 3,021,590:
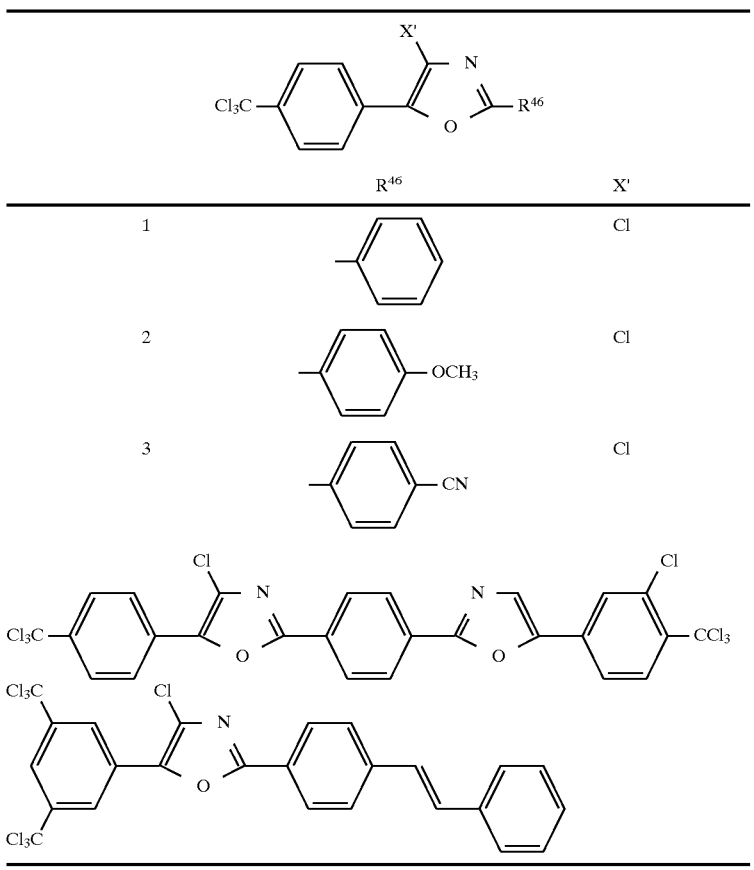
| | $R^{46}$ | X' |
|---|---|---|
| 1 | phenyl | Cl |
| 2 | 4-$OCH_3$-phenyl | Cl |
| 3 | 4-CN-phenyl | Cl |

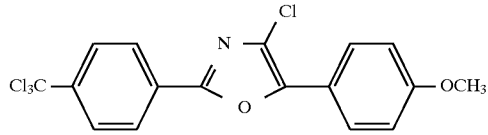
The aromatic onium salt as another example of component (iii) includes an aromatic onium salt of the elements belonging to Groups V, VI and VII of the Periodic Table, specifically, N, P, As, Sb, Bi, O, S, Se, Te and I. Examples of the aromatic onium salt include the compounds described in JP-B-52-14277, JP-B-52-14278 and JP-B-52-14279. Specific examples thereof include the following compounds.
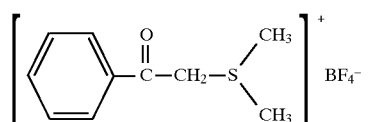
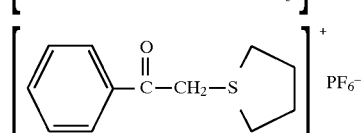
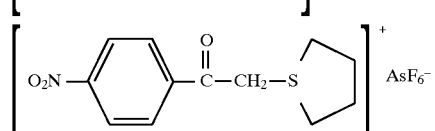
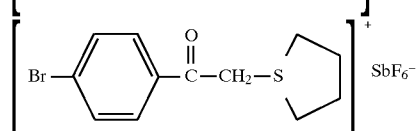
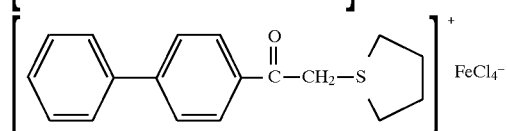
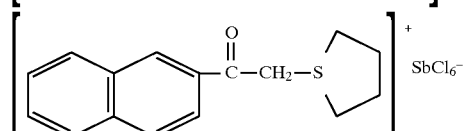
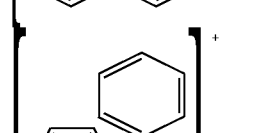
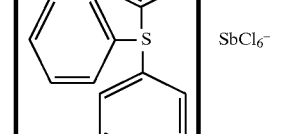
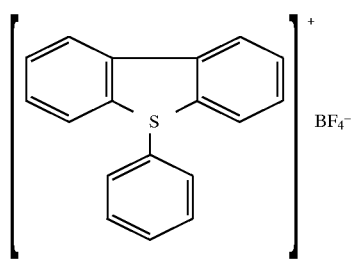
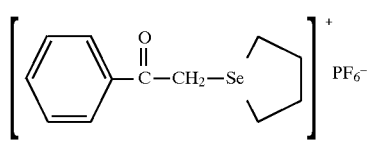
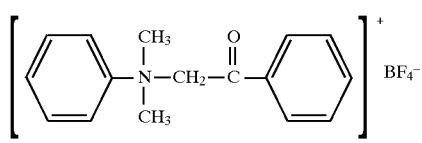
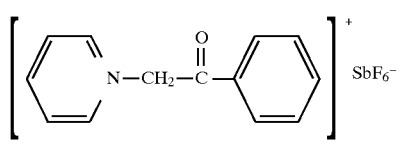
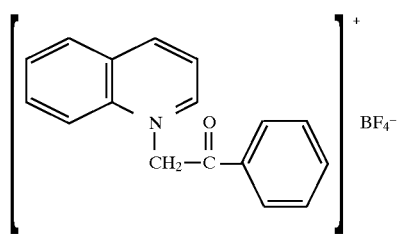
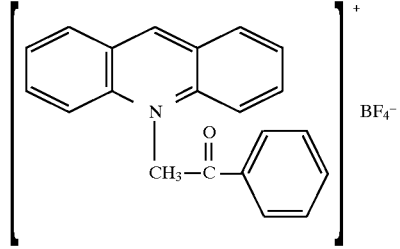
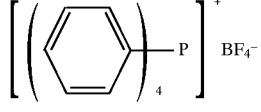
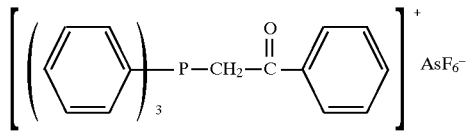
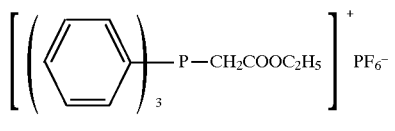

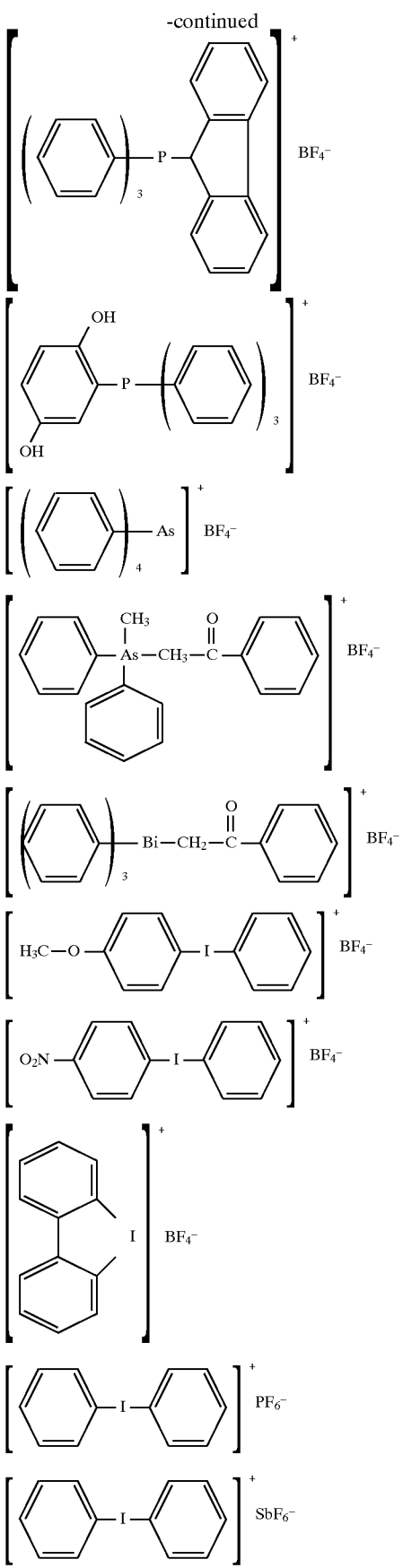

The organic peroxide as still another example of component (iii) for use in the present invention includes almost all organic compounds having one or more oxygen-oxygen bonds in the molecule and examples thereof include methyl ethyl ketone peroxide, cyclohexanone peroxide, 3,3,5-trimethylcyclo-hexanone peroxide, methylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butyl-peroxy)butane, tert-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tert-butyl peroxide, tert-butylcumyl peroxide, dicumyl peroxide, bis(tert-butylperoxyisopropyl)-benzene, 2,5-dimethyl-2,5-di(tert-butylperoxy)hexane, 2,5-oxanoyl peroxide, succinic peroxide, benzoyl peroxide, 2,4-dichlorobenzoyl peroxide, meta-toluoyl peroxide, diisopropyl peroxydicarbonate, di-2-ethylhexyl peroxydicarbonate, di-2-ethoxyethyl peroxydicarbonate, dimethoxyisopropyl peroxy- carbonate, di(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxy-3,5,5-trimethylhexanoate, tert-butyl peroxylaurate, tertiary carbonate, 3,3',4,4'-tetra-(t-butylperoxycarbonyl)-benzophenone, 3,3',4,4'-tetra-(t-aminoperoxycarbonyl) benzo-phenone, 3,3',4,4'-tetra-(t-hexylperoxycarbonyl) benzophenone, 3,3',4,4'-tetra(t-octylperoxycarbonyl) benzophenone, 3,3',4,4'-tetra(cumylperoxycarbonyl) benzophenone, 3,3',4,4'-tetra(p-isopropylcumylperoxycarbonyl)benzophenone, carbonyldi(t-butylperoxy dihydrogen diphthalate) and carbonyldi(t-hexylperoxy dihydrogen diphthalate).

Among these, preferred are peroxide esters such as 3,3',4,4'-tetra(t-butylperoxycarbonyl)benzophenone, 3,3',4,4'-tetra(t-aminoperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone and di-t-butyl diperoxyisophthalate.

The thio compound as an example of component (iii) for use in the present invention is represented by the following formula (IX):

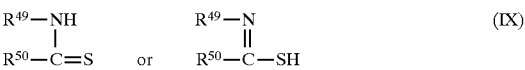

wherein $R^{49}$ represents an alkyl group, an aryl group or a substituted aryl group; $R^{50}$ represents a hydrogen atom or an alkyl group, and $R^{49}$ and $R^{50}$ may be combined with each other to represent a nonmetallic atom group necessary for forming a 5-, 6- or 7-membered ring which may contain a hetero atom selected from an oxygen atom, a sulfur atom and a nitrogen atom.

The alkyl group represented by $R^{49}$ in formula (IX) is preferably an alkyl group having from 1 to 4 carbon atoms. The aryl group represented by $R^{49}$ is preferably an aryl group having from 6 to 10 carbon atoms such as phenyl and naphthyl and the substituted aryl group includes the above-described aryl group substituted by a halogen atom such as chlorine, an alkyl group such as methyl or an alkoxy group such as methoxy or ethoxy. $R^{50}$ is preferably an alkyl group having from 1 to 4 carbon atoms.

Specific examples of the thio compound represented by formula (IX) include the following compounds.

| No. | R^49 | R^50 |
|---|---|---|
| 1 | H | H |
| 2 | H | $CH_3$ |
| 3 | $CH_3$ | H |
| 4 | $CH_3$ | $CH_3$ |
| 5 | $C_6H_5$ | $C_2H_5$ |
| 6 | $C_6H_5$ | $C_4H_9$ |
| 7 | $C_6H_4Cl$ | $CH_3$ |
| 8 | $C_6H_4Cl$ | $C_4H_9$ |
| 9 | $C_6H_4$—$CH_3$ | $C_4H_9$ |
| 10 | $C_6H_4$—$OCH_3$ | $CH_3$ |
| 11 | $C_6H_4$—$OCH_3$ | $C_2H_5$ |
| 12 | $C_6H_4OC_2H_5$ | $CH_3$ |
| 13 | $C_6H_4OC_2H_5$ | $C_2H_5$ |
| 14 | $C_6H_4OCH_3$ | $C_4H_9$ |
| 15 | | $-(CH_2)_2-$ |
| 16 | | $-(CH_2)_2-S-$ |
| 17 | | $-CH(CH_3)-CH_2-S-$ |
| 18 | | $-CH_2-CH(CH_3)-S-$ |
| 19 | | $-C(CH_3)_2-CH_2-S-$ |
| 20 | | $-CH_2-C(CH_3)_2-S-$ |
| 21 | | $-(CH_2)_2-O-$ |
| 22 | | $-CH(CH_3)-CH_2-O-$ |
| 23 | | $-C(CH_3)_2-CH_2-O-$ |
| 24 | | $-CH=CH-N(CH_3)-$ |
| 25 | | $-(CH_2)_3-S-$ |
| 26 | | $-(CH_2)_2-CH(CH_3)-S-$ |
| 27 | | $-(CH_2)_3-O-$ |
| 28 | | $-(CH_2)_5-$ |
| 29 | | $-C_6H_4-O-$ |
| 30 | | $-N=C(SCH_3)-S-$ |
| 31 | | $-C_6H_4-NH-$ |
| 32 | | 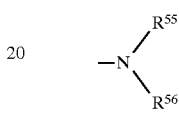 |

The hexaarylbiimidazole as another example of component (iii) for use in the present invention includes 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4', 5,5'-tetraphenylbiimidazole.

The ketooxime ester as another example of component (iii) for use in the present invention includes 3-benzoyl-oxyiminobutan-2-one, 3-acetoxyiminobutan-2-one, 3-propionyl-oxyiminobutan-2-one, 2-acetoxyiminopentan-3-one, 2-acetoxy-imino-1-phenylpropan-1-one, 2-benzoyloxyimino-1-phenyl-propan-1-one, 3-p-toluenesulfonyloxyiminobutan-2-one and 2-ethoxycarbonyloxyimino-1-phenylpropan-1-one.

The borate salt as still another example of component (iii) of the present invention includes the compounds represented by the following formula (X):

wherein $R^{51}$, $R^{52}$, $R^{53}$ and $R^{54}$, which may be the same or different, each represents a substituted or unsubstituted alkyl group, a substituted or unsubstituted aryl group, a substituted or unsubstituted alkenyl group, a substituted or unsubstituted alkynyl group or a substituted or unsubstituted heterocyclic group, two or more groups of $R^{51}$, $R^{52}$, $R^{53}$ and $R^{54}$ may be combined to form a cyclic structure, provided that at least one of $R^{51}$, $R^{52}$, $R^{53}$ and $R^{54}$ is a substituted or unsubstituted alkyl group; and $Z^+$ represents an alkali metal cation or a quaternary ammonium cation).

The alkyl group represented by $R^{51}$, $R^{52}$, $R^{53}$ or $R^{54}$ includes linear, branched and cyclic alkyl groups each preferably having from 1 to 18 carbon atoms. Specific examples thereof include methyl, ethyl, propyl, isopropyl, butyl, pentyl, hexyl, octyl, stearyl, cyclobutyl, cyclopentyl and cyclohexyl. The substituted alkyl group includes the above-described alkyl group having a substituent such as a halogen atom (e.g., —Cl, Br), a cyano group, a nitro group, an aryl group (preferably a phenyl group), a hydroxy group, $$-N\begin{matrix}R^{55}\\R^{56}\end{matrix}$$

(wherein $R^{55}$ and $R^{56}$ each independently represents a hydrogen atom, an alkyl group having from 1 to 14 carbon atoms or an aryl group), —$COOR^{57}$ (wherein $R^{57}$ represents a hydrogen atom, an alkyl group having from 1 to 14 carbon atoms or an aryl group), —$OCOR^{58}$ or —$OR^{58}$ (wherein $R^{58}$ represents an alkyl group having from 1 to 14 carbon atoms or an aryl group).

The aryl group represented by $R^{51}$, $R^{52}$, $R^{53}$ or $R^{54}$ includes a mono-, di- or tri-cyclic aryl group such as phenyl and naphthyl and the substituted aryl group includes the above-described aryl group which has a substituent described above for the substituted alkyl group or an alkyl group having from 1 to 14 carbon atoms.

The alkenyl group represented by $R^{51}$, $R^{52}$, $R^{53}$ or $R^{54}$ includes linear, branched and cyclic alkenyl groups each having from 2 to 18 carbon atoms and the substituent for the substituted alkenyl group includes the substituents described above for the substituted alkyl group.

The alkynyl group represented by $R^{51}$, $R^{52}$, $R^{53}$ or $R^{54}$ includes linear and branched alkynyl group each having from 2 to 28 carbon atoms and the substituent of the substituted alkynyl group includes the substituents described above for the substituted alkyl group.

The heterocyclic group represented by $R^{51}$, $R^{52}$, $R^{53}$ or $R^{54}$ includes 5- and greater membered, preferably 5- to 7-membered, heterocyclic groups each containing at least one of N, S and O and the heterocyclic group may contain a condensed ring and further may have a substituent described above for the substituted alkyl group.

Specific examples of the compound represented by formula (X) include the compounds described in U.S. Pat. Nos. 3,567,453 and 4,343,891 and European Patent Nos. 109,772 and 109,773 and the compounds described below.

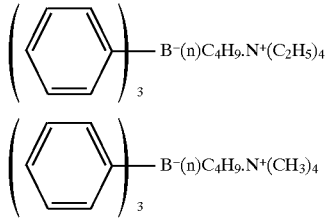

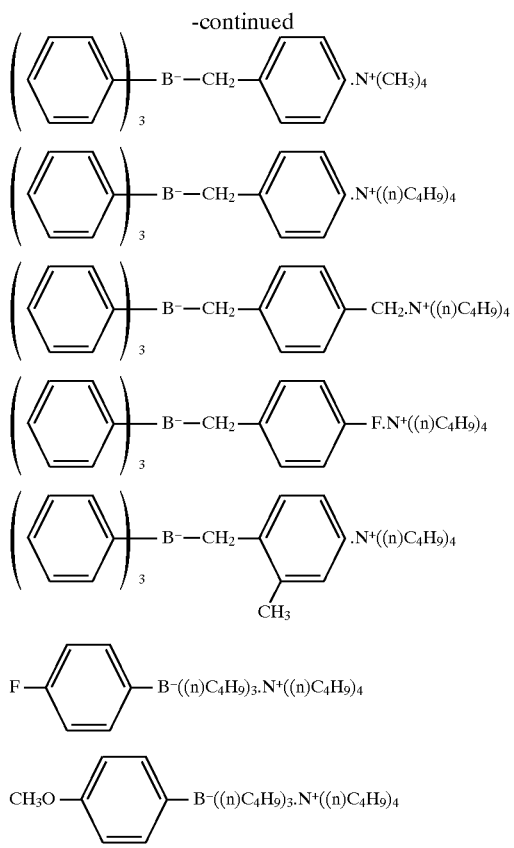

Examples of the azinium salt compound as another example of component (iii) of the present invention include the compounds having an N—O bond described in U.S. Pat. No. 4,743,528, JP-A-63-138345, JP-A-63-142345, JP-A-63-142346, JP-A-63-143537 and JP-B-46-42363. A specific example of the azinium salt compound is 1-methoxy-4-phenylpyridinium tetrafluoroborate.

Examples of the metallocene compound as still another example of component (iii) include various titanocene compounds described in JP-A-59-152396, JP-A-61-151197, JP-A-63-41484, JP-A-2-249, JP-A-2-4705 and JP-A-5-83588, such as dicyclopenta-dienyl-Ti-bis-phenyl, dicyclopentadienyl-Ti-bis-2,6-difluoro-phen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl and dimethylcyclopentadienyl-Ti-bis-2,3,4,5,6-pentafluoro-phen-1-yl. Also, the iron-allene complexes described in JP-A-1-304453 and JP-A-1-152109 may be suitably used.

Examples of the active ester compound as still another example of component (iii) include the imidosulfonate compounds described in JP-B-62-6223 and the active sulfonates described in JP-B-63-14340 and JP-A-59-174831.

The compounds as component (iii) of the present invention may be used individually or in combination of two or more thereof.

The concentration of the photopolymerization initiation system, namely, component (ii) and component (iii), contained in the composition of the present invention is usually low and if it is unduly excessive, disadvantageous results such as cutoff of effective light rays may be caused.

In the present invention, the amount of the photopolymerization initiation system is from 0.01 to 60%, preferably from 1 to 30%, based on the total amount of the photopolymerizable, ethylenically unsaturated compound and the linear organic high molecular polymer which is added if desired.

With respect to the ratio between component (ii) and component (iii) as the components in the photopolymerization initiation system used in the present invention, component (iii) is preferably used in an amount of from 0.01 to 50 parts by weight, more preferably from 0.02 to 20 parts by weight and most preferably from 0.05 to 10 parts by weight, per part by weight of the organic dye as component (ii).

The photopolymerizable composition of the present invention may further contain a known compound which acts to increase more the sensitivity or prevent the polymerization inhibition due to oxygen, as a co-sensitizer.

One example of the co-sensitizer includes amines and examples of the amine include the compounds described in M. R. Sander *Journal of Polymer Society*, Vol. 10, p. 3173 (1972), JP-B-44-20189, JP-A-51-82102, JP-A-52-134692, JP-A-59-138205, JP-A-60-84305, JP-A-62-18537, JP-A-64-33104 and *Research Disclosure*, No. 33825. Specific examples thereof include triethanolamine, ethyl p-dimethylaminobenzoate, p-formyldimethylaniline and p-methylthiodimethylaniline.

Another example of the co-sensitizer includes thiols and sulfides and examples of the thiol and the sulfide include the thiol compounds described in JP-A-53-705, JP-B-55-500806 and JP-A-5-142772 and the disulfide compounds described in JP-A-56-75643. Specific examples thereof include 2-mercapto-benzothiazole, 2-mercaptobenzoxazole, 2-mercaptobenzimidazole, 2-mercapto-4(3H)-quinazoline and β-mercaptonaphthalene.

Still another example of the co-sensitizer includes amino acid compounds (e.g., N-phenylglycine), organometallic compounds described in JP-B-48-42965 (e.g., tributyltin acetate), hydrogen donors described in JP-B-55-34414, sulfur compounds described in Japanese Patent Application No. 5-91089 (e.g. trithiane), phosphorus compounds described in JP-A-6-250389 (e.g., diethyl phosphite) and Si-H and Ge-H compounds described in Japanese Patent Application No. 6-191605.

Still another example of the co-sensitizer includes aminoketone compounds described in U.S. Pat. No. 4,318,791 and European Patent Application No. 0284561A1 and examples of the aminoketone compound include the following compounds.

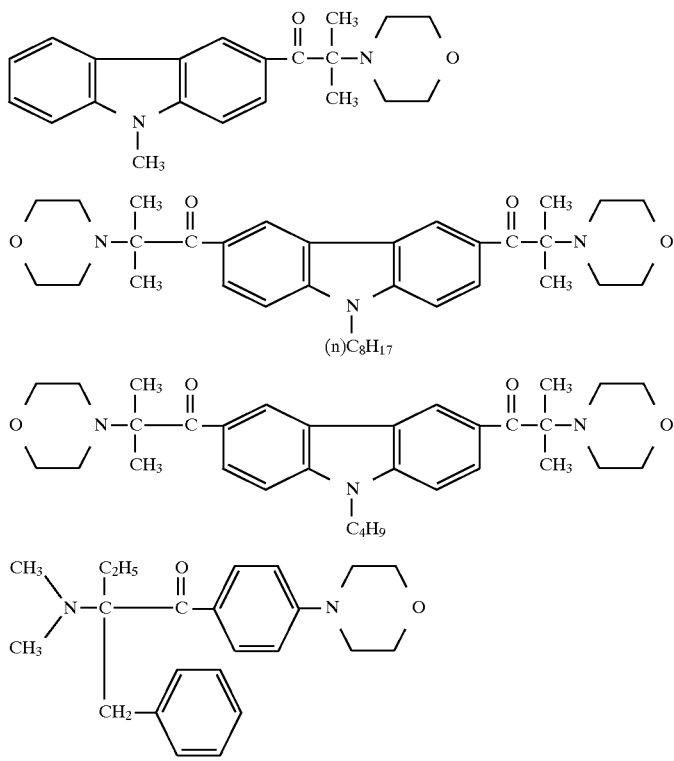

Another example of the co-sensitizer includes oxime ethers described in Japanese Patent Application No. 7-13108 and specific examples of the oxime ether include the following compounds.

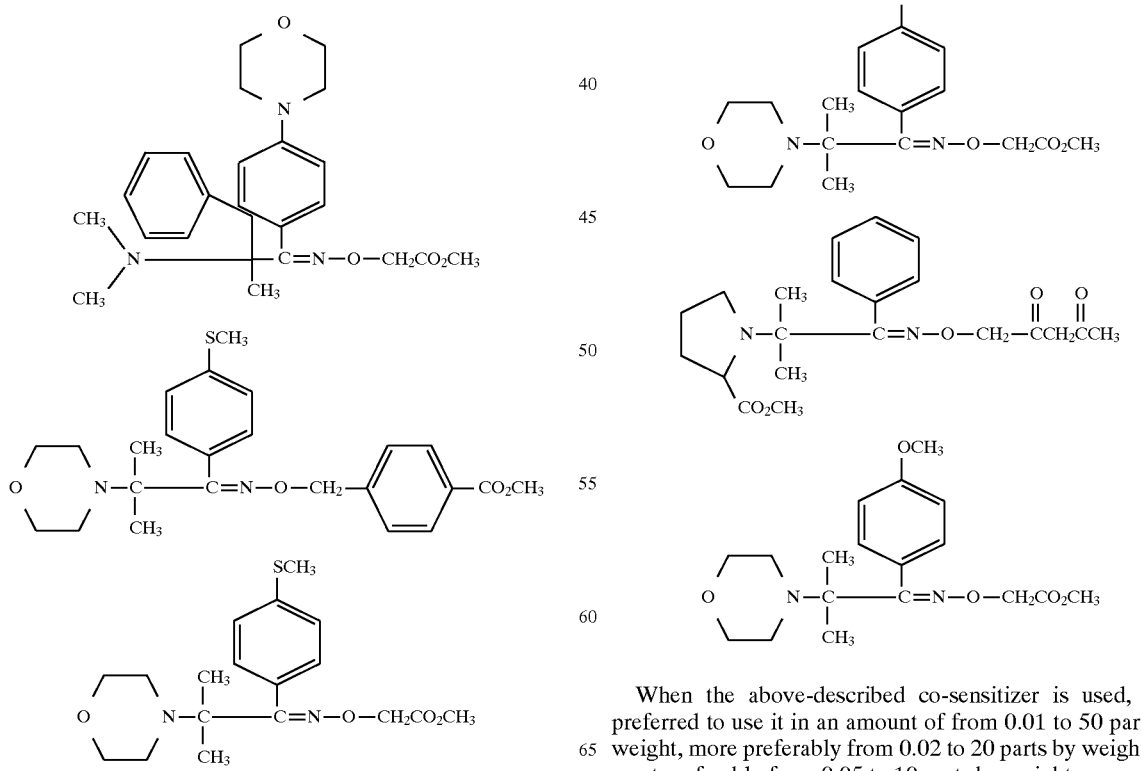

When the above-described co-sensitizer is used, it is preferred to use it in an amount of from 0.01 to 50 parts by weight, more preferably from 0.02 to 20 parts by weight and most preferably from 0.05 to 10 parts by weight, per part by weight of the compound as component (ii).

The photopolymerizable composition of the present invention preferably contains a linear organic high molecular polymer as a binder. The "linear organic high molecular polymer" may be any linear organic high molecular polymer as long as it has compatibility with the photopolymerizable, ethylenically unsaturated compound. Preferably, a water- or alkalescent water-soluble or swellable linear organic high molecular polymer capable of water development or alkalescent water development is selected. The linear organic high molecular polymer is used not only as the film forming agent of the composition but also as a developer appropriately selected depending on the use of water, alkalescent water or an organic solvent. For example, when a water-soluble organic high molecular polymer is used, water development can be carried out. This kind of linear organic high molecular polymer includes an addition polymer having a carboxylic acid group on the side chain and examples thereof include a methacrylic acid copolymer, an acrylic acid copolymer, an itaconic acid copolymer, a crotonic acid copolymer, a maleic acid copolymer and a partially esterified maleic acid copolymer described in JP-A-59-44615, JP-B-54-34327, JP-B-58-12577, JP-B-54-25957, JP-A-54-92723, JP-A-59-53836 and JP-A-59-71048. Further, an acidic cellulose derivative having a carboxylic acid group on the side chain may be included. An addition product of a cyclic acid anhydride to the addition polymer having a hydroxyl group may also be useful. Among these, a [benzyl (meth)-acrylate/(meth)acrylic acid/other addition polymerizable vinyl monomer, if desired] copolymer and an [allyl (meth)acrylate/(meth)acrylic acid/other addition polymerizable vinyl monomer, if desired] copolymer are preferred. In addition, polyvinyl pyrrolidone and polyethylene oxide are useful as a water-soluble linear organic polymer. Further, an alcohol-soluble polyamide and a polyether of 2,2-bis(4-hydroxy-phenyl)propane with epichlorohydrin are also useful so as to increase the strength of the cured film. The above-described linear organic high molecular polymer can be mixed into the entire composition in any amount. However, if the mixing amount exceeds 90 wt %, disadvantageous results may be caused in view of the strength of an image formed and the like. The mixing amount is preferably from 30 to 85%. The weight ratio of the photopolymerizable, ethylenically unsaturated compound to the linear organic high molecular polymer is preferably from 1/9 to 7/3, more preferably from 3/7 to 5/5.

In the present invention, other than the above-described fundamental components, a slight amount of a thermal polymerization inhibitor is preferably added so as to prevent unnecessary thermal polymerization of the polymerizable, ethylenically unsaturated compound during the production or storage of the photosensitive composition. Examples of suitable thermal polymerization inhibitors include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxyamine primary cerium salt and N-nitroso- phenylhydroxylamine aluminum salt. The addition amount of the thermal polymerization inhibitor is preferably from about 0.01 to about 5% based on the weight of the entire composition. Also, if desired, a higher fatty acid derivative such as a behenic acid and a behenic acid amide may be added to disperse unevenly on the surface of the photosensitive layer during the drying process after coating so as to prevent the polymerization inhibition due to oxygen. The addition amount of the higher fatty acid derivative is preferably from about 0.5 to about 10% of the entire composition.

In the present invention, a dye or a pigment may be added for the purpose of coloring the photosensitive layer. The addition amount of the dye or the pigment is from 0.01 to 20%, preferably from 0.5 to 10% of the entire composition. A pigment is preferred more than a dye.

As the pigment, commercially available pigments and known pigments described in various publications, for example, in C. I. Binran, "Saishin Gnaryo Binran", Nippon Ganryo Gijutsu Kyokai (compiler) (1977), Saishin Ganryo Oyo Gilutsu, CMC Shuppan (1986) and Insatsu Ink Gilutsu, CMC Shuppan (1984), can be used.

Examples of the pigment include a black pigment, a yellow pigment, an orange pigment, a brown pigment, a red pigment, a violet pigment, a blue pigment, a green pigment, a fluorescent pigment, a metal powder pigment and in addition, a polymer bonded dye. Specific examples thereof include an insoluble azo pigment, an azo lake pigment, a condensed azo pigment, a chelate azo pigment, a phthalocyanine-based pigment, an anthraquinone-based pigment, a perylene- or perynone-based pigment, a thioindigo-based pigment, a quinacridone-based pigment, a dioxazine-based pigment, an isoindolinone-based pigment, a quinophthalone-based pigment, a dyed lake pigment, an azine pigment, a nitroso pigment, a nitro pigment, a natural pigment, a fluorescent pigment and an inorganic pigment. Among these, preferred are an insoluble azo pigment, an azo lake pigment, a phthalocyanine-based pigment and an anthraquinone-based pigment.

The pigment may be dispersed in the presence of a polymer and examples of the polymer include polymers having an aliphatic double bond on the main chain or on the side chain as represented by formulae (x), (y) and (z) of Japanese Patent Application No. 6-193357:

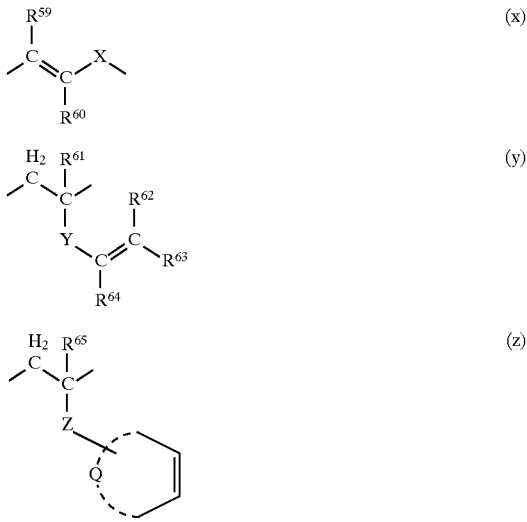

wherein $R^{59}$, $R_{60}$, $R^{61}$, $R^{62}$, $R^{63}$, $R^{64}$ and $R^{65}$ each independently represents a hydrogen atom, an alkyl group or an aryl group; x, Y and Z each independently represents a divalent linking group; and Q represents an atomic group necessary for forming an aliphatic ring.

The alkyl group includes an alkyl group preferably having from 1 to 20, more preferably from 1 to 10, still more preferably from 1 to 6, carbon atoms (e.g., methyl, ethyl, propyl, butyl, hexyl, isopropyl).

The aryl group includes an aryl group having from 6 to 22 carbon atoms (e.g., phenyl, naphthyl, anthryl).

The alkyl group or the aryl group may be substituted by a substituent such as an alkoxy group, an amido group or an alkoxycarbonyl group.

$R^{59}$, $R^{60}$, $R^{61}$, $R^{62}$, $R^{63}$, $R^{64}$ and $R^{65}$ are each preferably a hydrogen atom or an alkyl group, more preferably a hydrogen atom or methyl.

Examples of the divalent linking group represented by X or Y include an alkylene group, an arylene group, a carbonyl group, an imino group, an oxygen atom, a sulfur atom or a combination of these. The divalent linking group may be substituted by an aryl group, a halogen atom, a hydroxyl group or a cyano group.

The alkylene group includes an alkylene group having preferably from 2 to 10, more preferably from 2 to 6, still more preferably from 2 or 3, carbon atoms (e.g., —CH$_2$CH$_2$CH$_2$—, —CH$_2$CH$_2$—, —CH$_2$CH(CH$_3$)—).

The arylene group includes an arylene group having from 6 to 22 carbon atoms (e.g.,

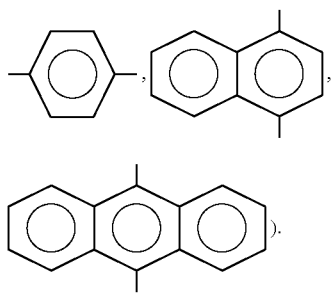

).

X is preferably an alkylene group.

Y is preferably an alkylene group, a carbonyl group, an oxygen atom or a combination of these.

The aliphatic ring formed by Q is preferably an aliphatic ring having from 5 to 30 carbon atoms resulting from combination of 5- or 6-membered rings (e.g., cyclohexane ring, norbornenyl ring, dicyclopentadiene ring). The aliphatic ring includes bicyclic or tricyclic hydrocarbon having a bridgehead carbon atom. The carbon-carbon double bond present in the aliphatic ring is preferably one by number.

The photopolymerizable composition of the present invention may contain an inorganic filler or other known additives for improving physical properties of the cured film.

Further, a surface active agent is preferably added so as to improve the surface state on coating.

The photopolymerizable composition of the present invention is dissolved in various organic solvents and then coated on a support. Examples of the solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents may be used individually or in combination. The solid concentration in the coating solution is suitably from 2 to 50 wt %. The coverage is in terms of the weight after drying preferably from about 0.1 to about 10 g/m$^2$, more preferably from 0.5 to 5 g/m$^2$.

As the above-described support, a dimensionally stable, plate-like material is used. Examples of the dimensionally stable, plate-like material include paper, paper laminated with plastics (e.g., polyethylene, polypropylene, polystyrene), sheet of a metal such as aluminum (including aluminum alloy), zinc or copper, a plastic film such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal, and paper or plastic film laminated with or having evaporated thereon the above-described metal. Among these supports, an aluminum plate is particularly preferred because it is dimensionally stable to an extreme extent and in addition, cheap. Also, a composite sheet obtained by bonding an aluminum sheet on a polyethylene terephthalate film described in JP-B-48-18327 may be preferably used.

A support having a metal, particularly an aluminum surface is preferably subjected to surface treatment such as graining treatment, dipping treatment in an aqueous solution of sodium silicate, potassium fluorozirconate or phosphate, or anodic oxidation treatment.

The graining treatment is preferably conducted by brush graining or electrolysis graining. In the case of electrolysis graining, the electrolyte is preferably an aqueous solution of nitric acid or hydrochloric acid, more preferably an aqueous solution of nitric acid.

An aluminum plate subjected to graining and then to dipping treatment in an aqueous solution of sodium silicate may be preferably used. Further, an aluminum plate subjected to anodic oxidation treatment and then to dipping treatment in an aqueous solution of alkali metal silicate described in JP-B-47-5125 may be also suitably used.

The anodic oxidation treatment is carried out by applying current to the aluminum plate as an anode in an electrolyte, for example, in an aqueous or non-aqueous solution of an inorganic acid such as phosphoric acid, chromic acid, sulfuric acid or boric acid or of an organic acid such as oxalic acid or sulfamic acid, which solutions may be used individually or in combination of two or more thereof.

The silicate electrodeposition described in U.S. Pat. No. 3,658,662 is also effective.

Further, the surface treatment comprising a combination of electrolysis graining with the above-described anodic oxidation treatment and sodium silicate treatment disclosed in JP-B-46-27481, JP-A-52-58602 and JP-A-52-30503 is also useful. In this case, the sodium silicate treatment may be omitted.

Furthermore, a support may also be suitably subjected to mechanical graining, chemical etching, electrolysis graining, anodic oxidation treatment and sodium silicate treatment successively as disclosed in JP-A-56-28893.

Still further, a support may be suitably subjected, after the above-described treatments, to undercoating by a water-soluble resin such as a polymer or copolymer having a polyvinyl phosphonic acid or a sulfonic acid group on the side chain, a polyacrylic acid, a water-soluble metal salt (e.g., zinc borate), or by a yellow dye or an amine salt.

The above-described treatment to achieve hydrophilicity is effected to render the support surface hydrophilic, to prevent harmful reaction of the photopolymerizable composition to be coated thereon and to improve the adhesion property of the photosensitive layer.

Further, the back surface of the support may be preferably subjected to backcoating described in JP-A-5-2271 and JP-A-6-35174 so as to prevent the elution of aluminum into the developer.

In order to prevent polymerization inhibition action of the oxygen in air, a protective layer comprising a polymer having an excellent oxygen cutting property, such as polyvinyl alcohol, in particular, polyvinyl alcohol having a saponification degree of 95% or more, or an acidic cellulose, may be provided on the photopolymerizable composition layer on the support. The coating method of the protective layer is described in detail, for example, in U.S. Pat. No. 3,458,311 and JP-A-55-49729. The coating amount thereof is preferably from 0.1 to 5.0 g, more preferably from 0.5 to 3 g.

The photopolymerizable composition of the present invention can be used for usual photopolymerization. Further, the composition can be used in various fields, for example, as a photoresist in producing a printing plate or a printed board. In particular, since the photopolymerizable composition of the present invention has such properties as high sensitivity and wide spectral sensitivity extending even to a visible light region, the composition can provide good effects when it is applied to a photosensitive material for a visible light laser such as an $Ar^+$ laser or a YAG-SHG laser.

Further, the photopolymerizable composition of the present invention is highly sensitive and has sensitivity to visible light and therefore, it can be advantageously used particularly for an image formation system using a microcapsule.

The application to the image formation system using a microcapsule is described in, for example, JP-A-57-197538, JP-A-61-130945, JP-A-58-88739, JP-A-58-88740 and European Patent Application No. 223,587A1. This image formation method comprises coating a microcapsule containing, for example, a photopolymerization initiator composition consisting of an ethylenic vinyl compound and a photopolymerization initiator and a dye precursor on a support, imagewise exposing the resulting photosensitive sheet to cure microcapsules on the exposed area, superposing a developer sheet thereon and applying pressure throughout the sheet to rapture the microcapsules on the unexposed area, whereby a dye image-forming material (e.g., a dye precursor) is transferred to an image-receiving element (e.g., developer layer) to form colors.

The photosensitive material using the photopolymerizable composition of the present invention may be heated after the imagewise exposure. The heating temperature is preferably from 60° to 160° C., more preferably from 80° to 130° C. The heating time is preferably from 1 second to 5 minutes.

The unexposed area of the photosensitive layer is removed by a developer to obtain an image. In using the photopolymerizable composition for producing a lithographic printing plate, the developer described in JP-B-57-7427 is preferred and an aqueous solution of an inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate or aqueous ammonia or of an organic alkali agent such as monoethanolamine or diethanolamine is suitably used. The alkali agent is added to give a concentration of from 0.1 to 10 wt %, preferably from 0.5 to 5 wt %.

The above-described alkaline aqueous solution may contain, if desired, a surface active agent or an organic solvent such as benzyl alcohol, 2-phenoxyethanol or 2-butoxyethanol, in a small amount. Examples thereof include those described in U.S. Pat. Nos. 3,375,151 and 3,615,480. Further, the developers described in JP-A-50-26601, JP-A-58-54341, JP-B-56-39464 and JP-B-56-42860 are also excellent.

However, the use of an organic solvent involves a hygienic problem such as toxicity and odor at the operation site, a safety problem such as firing, a problem in view of operationability such as generation of bubbles, or a problem of environmental pollution due to the waste water and accordingly, the developer preferably contains substantially no organic solvent. The aqueous alkali developer substantially free of an organic solvent, includes the developer compositions described in, for example, JP-A-59-84241 and JP-A-57-192952.

A commercially available developer which can be suitably used is a solution obtained by diluting DP-4 (produced by Fuji Photo Film Co., Ltd.) with water to from ⅙ to ⅟30.

The photosensitive lithographic printing plate using the photopolymerizable composition of the present invention may be subjected after development to such treatments as described in JP-A-54-8002, JP-A-55-115045 and JP-A-59-58431, more specifically, degreasing treatment through or without water washing, treatment with an aqueous solution containing an acid or degreasing treatment after treatment with an aqueous solution containing an acid. In the development process of this kind of photosensitive lithographic printing plate, the aqueous alkali solution is consumed according to the processed amount to cause reduction in the alkali concentration or the alkali concentration is reduced due to air in a long-time operation in an automatic developing machine to lower the processing capability. In this case, the processing capability can be recovered by the replenishers and the replenishing methods described in JP-A-54-62004, JP-A-55-22759, JP-A-55-115039, JP-A-56-12645, JP-A-58-95349, JP-A-64-21451, JP-A-1-180548 and JP-A-2-3065.

The above-described print-making process is preferably carried out in an automatic developing machine described in JP-A-2-7054 and JP-A-2-32357. As the degreasing gum to be coated, if desired, at the final step of the print-making process, those described in JP-B-62-16834, JP-B-62-25118, JP-B-63-52600, JP-A-62-7595, JP-A-62-11693 and JP-A-62-83194 are preferably used.

After the development, the printing plate may be subjected to burning heat treatment or post exposure to improve the printing durability at printing.

The photopolymerizable composition of the present invention exhibits high sensitivity to active light rays ranging from ultraviolet light to visible light. Accordingly, an ultrahigh-pressure mercury lamp, a high-pressure mercury lamp, a medium-pressure mercury lamp, a low-pressure mercury lamp, a chemical lamp, a carbon arc lamp, a xenon lamp, a metal halide lamp, various laser lamps such as a visible laser lamp and an ultraviolet laser lamp, a fluorescent lamp, a tungsten lamp or sunlight can be used as a light source.

The present invention will be described below in greater detail by referring to the examples, but the present invention should not be construed as being limited to these examples. All parts, percents, ratios and the like are based on weight unless otherwise indicated.

EXAMPLE

A 0.3 mm-thick aluminum plate was dipped in a 10% sodium hydroxide at 60° C. for 25 seconds to effect etching, washed with flowing water, neutralization-washed with a 20% nitric acid and then washed with water. The resulting plate was subjected to electrolysis graining treatment using a sinewaveform alternating current in a 1% aqueous nitric acid solution at an anode electricity quantity of 300 coulomb/dm². Subsequently, the plate was dipped in an aqueous solution of a 1% sodium hydroxide at 40° C. for 5 seconds and then dipped in an aqueous solution of a 30% sulfuric acid to effect desmutting at 60° C. for 40 seconds. Thereafter, the plate was subjected to anodic oxidation treatment in an aqueous solution of a 20% sulfuric acid at a current density of 2 A/dm² for 2 minutes to give an anodically oxidized film thickness of 2.7 g/m². The surface roughness measured was 0.3 μ(Ra indication).

The following sol-gel reaction solution was coated on the back surface of the thus-treated substrate by a bar coater and dried at 80° C. for 1 minute to prepare Support A with a backcoat layer having a coated amount after drying of 70 mg/M².

Preparation of Sol-Gel Reaction Solution:

| | |
|---|---|
| Tetraethyl silicate | 50 parts by weight |
| Water | 20 parts by weight |
| Methanol | 15 parts by weight |
| Phosphoric acid | 0.05 part by weight |

The above-described components were mixed and stirred and then heat generation started in about 5 minutes. After allowing them to react for 60 minutes, the following solution was added thereto to prepare a coating solution for the backcoat layer.

| | |
|---|---|
| Pyrogallol formaldehyde condensed resin (M.W. 2,000) | 4 parts by weight |
| Dimethyl phthalate | 5 parts by weight |
| Fluorine surface active agent (N-butyl perfluorooctane sulfonamidoethylacrylate/ polyoxyethylene acrylate copolymer, molecular weight: 20,000) | 0.7 part by weight |
| Methanol silica sol (produced by Nissan Chemical Co., Ltd., methanol: 30%) | 50 parts by weight |
| Methanol | 800 parts by weight |

The photosensitive composition having the following composition was coated on the surface of the aluminum plate treated as above to give a dry coated weight of 1.5 g/m² and dried at 80° C. for 2 minutes to form a photosensitive layer.

| | |
|---|---|
| Pentaerythritol tetraacrylate | 2.0 g |
| Allyl methacrylate/methacrylic acid copolymer (copolymerization molar ratio: 80/20) | 2.0 g |
| Component (ii) | X g |
| Component (iii) | Y g |
| Co-sensitizer (S) | Z g |
| Fluorine nonionic surface active agent (F-177, produced by Dai-Nippon Ink & Chemicals, Inc.) | 0.03 g |
| Thermal polymerization inhibitor: N-nitrosophenylhydroxylamine aluminum salt | 0.01 g |
| Pigment Dispersion | 2.0 g |

-continued

Composition:

| | |
|---|---|
| P.B. 15:6 (copper phthalocyanine) | 30 parts |
| Allyl methacrylate/methacrylic acid copolymer (copolymerization molar ratio: 83/17) | 20 parts |
| Cyclohexanone | 35 parts |
| Methoxypropyl acetate | 35 parts |
| Propylene glycol monomethyl ether | 80 parts |
| Methyl ethyl ketone | 20 g |
| Propylene glycol monomethyl ether | 20 g |

The specification of component (ii), component (iii) and co-sensitizer (S) is described in Table A below.

On the thus-provided photosensitive layer, a 3 wt % aqueous solution of polyvinyl alcohol (saponification degree: 98 mol %, polymerization degree: 1,000) was coated to give a dry coated weight of 2 g/m² and dried at 100° C. for 2 minutes to form a protective layer.

FUJI PS Step Guide (a gray scale having ΔD=0.15 and discontinuously changed in the transmission density, manufactured by Fuji Photo Film Co., Ltd.) was put into close contact with the photosensitive material obtained above and light for exposure was irradiated thereon.

The light source used was a xenon lamp and light was irradiated through Kenko Optical Filter BP-53. The energy on the PS Step Guide surface was 0.25 mJ/cm².

The exposed photosensitive material was heated at 120° C. for 20 seconds and then developed. The sensitivity was shown by a clear stage number after development of the PS Step Guide. The larger the stage number was, the higher the sensitivity was. The development was conducted by dipping the photosensitive material in the following developer at 25° C. for 10 seconds.

| | |
|---|---|
| DP-4 (produced by Fuji Photo Film Co., Ltd.) | 65.0 g |
| Water | 880.0 g |
| Lipomin LA (20% aq. soln.) | 50.0 g |

TABLE A

| | Photopolymerization Initiator | | | | | | Sensitivity to Light through BP-53 Filter |
|---|---|---|---|---|---|---|---|
| | Component (ii) | X g | Component (iii) | Y g | Co-sensitizer (S) | Z g | (stage number of step wedge) |
| Example 1 | I-1 | 0.10 | (B) | 0.10 | | | 5.5 |
| Example 2 | I-2 | 0.10 | (B) | 0.10 | | | 6.5 |
| Example 3 | I-3 | 0.10 | (B) | 0.10 | | | 6.0 |
| Example 4 | I-6 | 0.12 | (B) | 0.10 | | | 7.0 |
| Example 5 | I-12 | 0.13 | (B) | 0.10 | | | 5.5 |
| Example 6 | I-17 | 0.10 | (B) | 0.10 | | | 3.0 |
| Example 7 | I-1 | 0.10 | (B) | 0.10 | (D) | 0.20 | 6.5 |
| Example 8 | I-1 | 0.10 | (C) | 0.10 | (D) | 0.20 | 6.5 |
| Example 9 | I-1 | 0.10 | (B) | 0.10 | (E) | 0.20 | 7.0 |
| Comparative Example 1 | (A) | 0.10 | (B) | 0.10 | | | 0.5 |
| Comparative Example 2 | (A) | 0.10 | (B) | 0.10 | (D) | 0.20 | 1.0 |

A photosensitive material comprising a photosensitive layer having the following composition was prepared in the same manner as above and examined on the sensitivity through BP-49 filter.

| Pentaerythritol tetraacrylate | 2.4 g |
|---|---|
| Allyl methacrylate/methacrylic acid copolymer (copolymerization molar ratio: 75/25) | 2.0 g |
| Component (ii) | X g |
| Component (iii) | Y g |
| Co-sensitizer (S) | Z g |
| Fluorine nonionic surface active agent (F-177, produced by Dai-Nippon Ink & Chemicals, Inc.) | 0.03 g |
| Thermal polymerization inhibitor: N-nitrosophenylhydroxylamine aluminum salt | 0.01 g |
| Pigment Dispersion Composition: | 2.0 g |
| P.B. 15:6 (copper phthalocyanine) | 30 parts |
| Allyl methacrylate/methacrylic acid copolymer (copolymerization molar ratio: 83/17) | 20 parts |
| Cyclohexanone | 35 parts |
| Methoxypropyl acetate | 35 parts |
| Propylene glycol monomethyl ether | 80 parts |
| Methyl ethyl ketone | 20 g |
| Propylene glycol monomethyl ether | 20 g |

The specification of component (ii), component (ii) and co-sensitizer (S) is described in Table B below.

TABLE B

| | Photopolymerization Initiator | | | | | | Sensitivity to Light through BP-49 Filter |
|---|---|---|---|---|---|---|---|
| | Component (ii) | X g | Component (iii) | Y g | Co-sensitizer (S) | Z g | (stage number of step wedge) |
| Example 10 | I-1 | 0.12 | (B) | 0.14 | | | 7.5 |
| Example 11 | I-2 | 0.12 | (B) | 0.14 | | | 8.5 |
| Example 12 | I-10 | 0.13 | (B) | 0.14 | | | 7.5 |
| Example 13 | I-11 | 0.13 | (B) | 0.11 | | | 8.0 |
| Example 14 | I-12 | 0.12 | (B) | 0.13 | | | 7.5 |
| Example 15 | I-17 | 0.12 | (B) | 0.12 | | | 7.5 |
| Example 16 | I-2 | 0.12 | (B) | 0.11 | (E) | 0.20 | 9.5 |
| Comparative Example 3 | (A) | 0.12 | (B) | 0.14 | | | 6.0 |
| Comparative Example 4 | (A) | 0.12 | (B) | 0.11 | (E) | 0.20 | 7.0 |

Compounds o=in Tables A and B

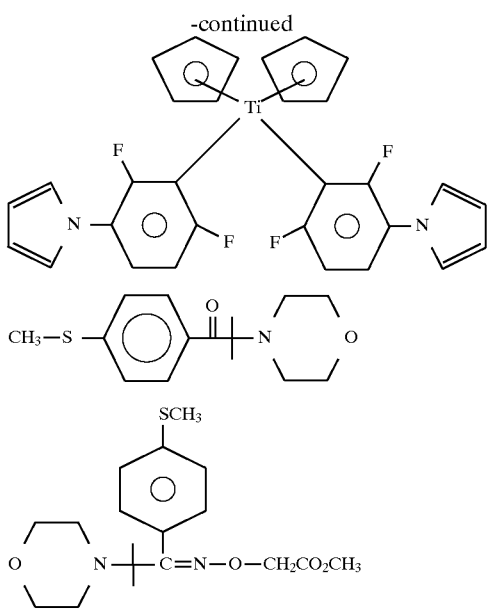

It is apparent that component (ii) of the present invention is superior in the photosensitivity to visible light and remarkably excellent in the photosensitivity to light having a wavelength longer than 500 nm as compared with comparative compounds.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising the following is components (i), (ii) and (iii):

(i) a compound having at least one addition-polymerizable, ethylenically unsaturated bond;

(ii) a compound represented by formula (I):

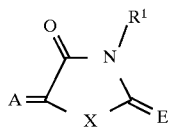

wherein A=represents formula (A-1) or (A-2):

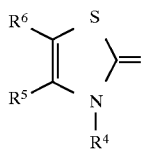

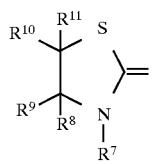

wherein $R^4$, $R^5$, $R^6$, $R^7$, $R^8$, $R^9$, $R^{10}$ and $R^{11}$ each independently represents a monovalent nonmetallic atom group, and $R^5$ and $R^6$, $R^8$ and $R^9$, $R^8$ and $R^{10}$, $R^9$ and $R^{11}$, or $R^{10}$ and $R^{11}$ may be combined with each other to form a saturated or unsaturated aliphatic ring;

—X— represents —O—, —S—, —NR$^2$— or —CONR$^3$—, in which $R^1$, $R^2$ and $R^3$ each independently represents a hydrogen atom, an alkyl group, a substituted alkyl group, an aryl group, a substituted aryl group, an alkenyl group, a substituted alkenyl group, an alkynyl group or a substituted alkynyl group, and =E represents a substituted or unsubstituted 1,3-dihydro-1-oxo-2H-inden-2-ylidene group; and (iii) a compound which generates an active radical upon light irradiation in the co-presence of component (ii).

2. The photopolymerizable composition according to claim 1 wherein component (i) is an ester of an unsaturated carboxylic acid with an aliphatic polyhydric alcohol compound.

3. The photopolymerizable composition according to claim 1 wherein component (ii), A=is a substituted or unsubstituted 2(3H)-thiazolylidene.

4. The photopolymerizable composition according to claim 3, wherein component (ii), —X— is —S—.

5. The photopolymerizable composition according to claim 1 wherein component (ii), A=is a substituted or unsubstituted 2-thiazolidinylidene.

6. The photopolymerizable composition according to claim 1 wherein component (iii) is a compound having a carbon halogen bond which generates an active radical upon light irradiation in the co-presence of component (ii).

7. The photopolymerizable composition according to claim 1 wherein component (i) is an ester of an unsaturated carboxylic acid with an aliphatic polyhydric alcohol compound, in component (ii) A=is a substituted or unsubstituted 2(3H)-thiazolylidene and —X— is —S—, and component (iii) is a compound having a carbon halogen bond which generates an active radical light irradiation in the co-presence of component (ii).

8. A composition according to claim 4, wherein component (iii) is a compound selected from those represented by the following formula (II):

wherein X represents a halogen atom; $Y^1$ represents —CX'$_3$, NH$_2$, —NHR', —NR'$_2$, or —OR', wherein R' represents an alkyl group, a substituted alkyl group, an aryl group or a substituted aryl group; and R represents —CX$_3$, an alkyl group, a substituted alkyl group, an aryl group, a substituted aryl group or a substituted alkenyl group.

* * * * *